United States Patent [19]
Tobita et al.

[11] Patent Number: 5,490,116
[45] Date of Patent: Feb. 6, 1996

[54] SEMICONDUCTOR MEMORY DEVICE INCLUDING A COMPONENT HAVING IMPROVED BREAKDOWN VOLTAGE CHARACTERISTICS

[75] Inventors: Yoichi Tobita; Kenji Tokami, both of Hyogo, Japan

[73] Assignee: Mitsubishi Denki Kabushiki Kaisha, Tokyo, Japan

[21] Appl. No.: 151,248

[22] Filed: Nov. 12, 1993

[30] Foreign Application Priority Data

Dec. 18, 1992 [JP] Japan ..................................... 4-338705

[51] Int. Cl.$^6$ ..................................................... G11C 7/00
[52] U.S. Cl. ........................... 365/226; 365/149; 365/182; 365/230.06
[58] Field of Search ..................................... 365/149, 182, 365/226, 230.06

[56] References Cited

U.S. PATENT DOCUMENTS 4,788,664  11/1988  Tobita .................................. 365/230.01
4,980,799  12/1990  Tobita .................................. 365/182 X

FOREIGN PATENT DOCUMENTS 49-114337  6/1974  Japan.
2-273393   4/1990  Japan.

OTHER PUBLICATIONS

Martino Jr., et al., "An On–Chip Back–Bias Generator for MOS Dynamic Memory", IEEE Journal of Solid–State Circuits, vol. SC–15, No. 5, Oct. 1980, pp. 820–826.

Primary Examiner—David C. Nelms
Assistant Examiner—F. Niranjan
Attorney, Agent, or Firm—Lowe, Price, LeBlanc & Becker

[57] ABSTRACT

In a semiconductor memory device including a boosting circuit for generating a high voltage constantly, and a word line driving circuit for transmitting a high voltage from the boosting circuit on a selected word line, a capacitor for stabilizing the high voltage generated by the boosting circuit is formed of a series of capacitive elements using a FET having a gate insulating film identical in thickness to that of a insulating gate type field effect transistor in the memory device. A voltage applied across each capacitive element is relaxed, and the capacitor is improved in dielectric breakdown voltage characteristics, to stably supply the high voltage.

9 Claims, 18 Drawing Sheets

SEMICONDUCTOR MEMORY DEVICE INCLUDING A COMPONENT HAVING IMPROVED BREAKDOWN VOLTAGE CHARACTERISTICS

BACKGROUND OF THE INVENTION

1. Field of the Invention

The present invention relates to semiconductor memory devices, and more particularly, to improvement of a circuit for transmitting a driving signal boosted to a potential level exceeding internal power supply voltage to a selected word line. Particularly, the present invention relates to a structure for stabilizing an output voltage of a boosting circuit used for generating a boosted word line driving signal and a structure of an input buffer for receiving an external signal.

2. Description of the Background Art

FIG. 25 schematically shows a structure of a conventional dynamic random access memory. Referring to FIG. 25, a dynamic random access memory includes a memory cell array MA in which memory cells for storing information are arranged in a matrix of rows and columns, an address buffer AB responsive to externally applied address A0-An for generating an internal address, an X decoder ADX for receiving an internal row address from address buffer AB for generating a word line selecting signal selecting a corresponding row of memory cell array MA, a word line driving circuit WD responsive to a word line selecting signal from X decoder ADX for amplifying this word line selecting signal to transmit the same to a selected row (word line), and an Y decoder ADY for receiving an internal column address from address buffer AB for generating a column selecting signal selecting a corresponding column out of memory cell array MA.

Address buffer AB receives in a time-divisional manner a row address specifying a row and a column address specifying a column out of memory cell array MA for generating an internal row address and an internal column address at respective predetermined timings to provide the same to X decoder ADX and Y decoder ADY.

In order to read out data from a memory cell specified by external address A0-An (a memory cell provided corresponding to a crossing of a selected row and column), the dynamic random access memory includes a sense amplifier for detecting and amplifying data of a memory cell connected to a row selected by a word line selecting signal from X decoder ADX and to which a driving signal is transmitted by word line driving circuit WD, and an input/output interface (IO) responsive to a column selecting signal from Y decoder ADY for transmitting to an output buffer OB data of a memory cell connected to a corresponding column out of the memory cells of a selected row (word line). In FIG. 25, the sense amplifier and the input/output interface (IO) are indicated by one block SI.

Output buffer OB generates an external read out data from internal data transmitted via input/output interface (IO) to provide the same external to the device.

Although only output buffer OB for reading out the data is indicated in FIG. 25, an input buffer is also provided for writing data. This input buffer may be implemented to input data from an external device via a pin terminal identical to that of output buffer OB or via a different pin terminal. An input buffer generates an internal write data from an externally applied write data to write the data into a selected memory cell via an input/output interface (I/O).

Control signal generating peripheral circuitry CG for generating control signals to control various operation timings of a dynamic random access memory is provided. Control signal generating peripheral circuitry CG responds to an externally applied control clock signal, i.e. a row address strobe signal /RAS, a column address strobe signal /CAS, and a write enable signal /WE to generate a word line driving signal $\phi x$, an equalize signal $\phi E$, a precharge signal $\phi p$, and sense amplifier activation signals $\phi A$ and $\phi B$. Control signal generating peripheral circuitry CG also generates a precharge potential VB for precharging a bit line or the like to a predetermined potential.

FIG. 26 schematically shows a structure of the memory cell array of FIG. 25 and relating circuitry. Referring to FIG. 26, a memory cell array MA includes a plurality of memory cells 1 arranged in a matrix of rows and columns (n rows, m columns), word lines WL1, WL2, . . . , WLn provided corresponding to the rows of memory cell array MA, and bit lines BL0, /BL0, BL1, /BL1, . . . , BLm, /BLm, provided corresponding to each column in memory cell array MA. A bit line BL (indicating generically bit lines BL0-BLm) and a bit line /BL (indicating generically complementary bit lines /BL0-/BLm) form a folded type complementary bit line pair. One pair of bit lines connects memory cells 1 of one column in memory cell array MA.

In FIG. 26, a bit line BL0 and a complementary bit line /BL0 form a pair of bit lines, and a bit line BL1 and a complementary bit line /BL1 form another pair of bit lines. Similarly, a bit line BLm and a complementary bit line BLm form a pair of bit lines.

A memory cell 1 is provided corresponding to the crossing of one word line and one of the pair of bit lines. More specifically, memory cell 1 is provided corresponding to the crossing of one word line WL (indicating generically word lines WL1-WLn) and one of the bit line pair BL or /BL.

A precharge/equalize (P/E) circuit 150 for equalizing the potential of each bit line at the time of standby of a dynamic random access memory and for precharging to a predetermined potential VB is provided to each pair of bit lines BL0, /BL0, . . . , BLm, /BLm. Each precharge/equalize circuit 150 attains a conducting state in response to a precharge designating signal $\phi p$ and an equalize designating signal $\phi E$ to precharge and equalize the potential of each bit lines BL0, /BL0-BLm, /BLm to a predetermined precharge potential VB.

A sense amplifier circuit 160 for detecting and amplifying data of a selected memory cell is provided for each bit line pairs BL and /BL. Sense amplifier circuit 160 is activated in response to a first sense amplifier driving signal $\phi A$ and a second sense amplifier driving signal $\phi B$ transmitted via signal lines 162 and 164, respectively, to detect the potential difference of a corresponding bit line pair for differential amplification.

Column selecting gates T0a, T0b, T1a, T1b, . . . Tma, Tmb are provided for each of bit line pairs B10 /BL0, . . . , BLm, /BLm, responsive to column selecting signals Y0-Ym from Y decoder ADY to attain an ON state for connecting a corresponding pair of bit lines to internal data bus DB, /DB. Internal data bus DB and /DB are connected to output buffer OB shown in FIG. 25.

Column selecting gates T0a, T0b are provided corresponding to the pair of bit lines BL0, /BL0. Column selecting gates T1a and T1b are provided corresponding to the pair of bit lines BL1, /BL1. Column selecting gates Tma and Tmb are provided corresponding to the pair of bit lines BLm, /BLm.

Only one of column selecting signals Y0-Ym from Y decoder ADY is activated according to a column address, whereby the corresponding column selecting gate is turned on. As a result, a corresponding pair of bit lines is connected to internal data bus DB and /DB.

FIG. 27 shows the structure of components associated with one word line of FIG. 26, and particularly indicates the specific structure of the circuit driving a word line.

Referring to FIG. 27, memory cell 1 disposed at the crossing of a word line 3 (WLi) and a bit line 2 (BLj) includes a memory capacitor 6 for storing information in the form of charge, and a selecting transistor 5 turned on in response to a word line driving signal $\phi xi$ transmitted on word line 3 to connect memory capacitor 6 to bit line 2. Selecting transistor 5 is formed of an n channel insulating gate type field effect transistor (referred to simply as "n-FET" hereinafter), having the gate connected to word line 3, the source to bit line 2, and the drain to storage node 4.

Memory capacitor 6 has one electrode connected to the drain of selecting transistor 5 via storage node 4, and the other electrode connected to receive a potential of ½ the operating power supply potential Vcc.

Word line 3 is accompanied with a parasitic capacitance 7. Parasitic capacitance 7 also includes the gate capacitance of selecting transistor 5 of memory cell 1.

Corresponding to word line 3 (WLi), a (unit) X decoder ADXi for decoding an internal row address from the address buffer for generating a word line selecting signal for word line 3 (WLi), and a (unit) word line driver WDi for receiving an output of X decoder ADXi via a node 9 and transmitting a word line driving signal $\phi xi$ on word line 3 are provided.

X decoder ADXi generates a signal of "H" (logical high) on node 9 when selected.

Word line driver WDi includes an n-FET 14 for passing along a signal from X decoder ADXi provided on node 9, an n-FET 11 responsive to a signal on node 15 transmitted from n-FET 14 for transmitting a word line driving signal $\phi x$ from node 10 to word line 3 via a node 13, an inverter circuit 16 for inverting an output of X decoder ADX applied on node 9, and an n-FET 12 responsive to an output of inverter circuit 16 for discharging the potential of word line 3 (WLi) to the level of ground potential via node 13.

n-FET 14 receives an internal operating power supply voltage Vcc at its gate. Word line driving signal $\phi x$ applied to node 10 is a signal boosted to a potential level higher than internal operating power supply voltage Vcc. Here, the potential of node 15 rises (due to capacitive coupling between the gate and drain of the n-FET) by the self-bootstrap function of n-FET 11. n-FET 14 is provided to prevent the boosted potential of node 15 from being transmitted to node 9. In other words, n-FET 14 functions as a decoupling transistor.

Inverter circuit 16 has a CMOS structure. The operating power supply voltage is set to internal operating power supply voltage Vcc (not shown) applied to node 8.

Word line driver WDi functions to receive a word line selecting signal of the level of internal operating power supply voltage Vcc from X decoder ADXi and apply the ability of driving word line 3 to this signal.

In order to generate a word line driving signal $\phi x$ of a boosted potential level, a high voltage generation circuit HVG and a word line driving signal generation circuit HSG are provided. High voltage generation circuit HVG responds to a pulse-like repetitive signal $\phi c$ to boost constantly internal operating power supply voltage Vcc for generating a boosted high voltage Vpp. Word line driving signal generation circuit HSG responds to a clock signal $\phi x0$ for transmitting high voltage Vpp generated from high voltage generation circuit HVG to a node 18 as a word line driving signal $\phi x$. A clock signal $\phi x0$ is generated at a timing before the output potential of X decoder ADXi is ascertained (generated after a predetermined time elapse in response to the fall of row address strobe signal /RAS).

The repetitive signal $\phi c$ is generated from an on-chip ring oscillator or provided from an external source.

High voltage generation circuit HVG includes an n-FET 29 provided between internal power supply voltage node 8 and node 32, an n-FET 30 provided between nodes 35 and 27, a capacitor 31 provided between nodes 28 and 35, and a capacitor 33 provided between output node 27 and a second power supply voltage supplying source (ground potential source).

n-FET 29 has its gate and drain connected to charge the node 32 according to internal operating power supply voltage Vcc applied to node 8. n-FET 30 has the gate and drain connected and functions as a diode. Capacitor 31 provides capacitive coupling between nodes 28 and 35. Node 35 (node 32) is accompanied with a parasitic capacitance 34. Capacitor 33 serves to stabilize a high voltage Vpp generated at output node 27. Capacitor 31 serves to boost the potential level of node 35 by the repetitive signal $\phi c$. High voltage generation circuit HVG generates high voltage Vpp of a voltage level higher than internal power supply voltage Vcc by the charge pumping function of capacitor 31.

Word line driving signal generation circuit HSG includes a p channel insulating gate type field effect transistor (referred to simply as "p-FET" hereinafter) 23 provided between nodes 17 and 25, a p-FET 20 provided between nodes 17 and 22, an n-FET 24 responsive to a control signal $\phi x0$ provided to node 19 for discharging node 25 to the level of ground potential, an inverter circuit 26 for inverting control signal $\phi x0$, and an n-FET 21 responsive to an output of inverter circuit 26 for reducing the potential of node 22 to ground level. p-FET 23 and p-FET 20 have their gates and drains cross-coupled. High voltage Vpp from high voltage generation circuit HVG is transmitted to node 17. A word line driving signal $\phi x$ is generated to an output node 18 of word line driving signal generation circuit HSG. Word line driving signal generation circuit HSG functions to convert control signal $\phi x0$ of the level of internal operating power supply voltage Vcc applied to node 19 to a word line driving signal $\phi x$ of a level of high voltage Vpp. The structure of such a circuit with this function is disclosed in Japanese Patent Laying Open No. 49-114337.

High voltage generation circuit HVG and word line driving signal generation circuit HSG are included in control signal generating peripheral circuitry CSG shown in FIG. 25. Inverter circuit 26 has a CMOS structure to operate with internal operating power supply voltage Vcc as the operating power supply voltage. High voltage generation circuit HVG and word line driving signal generation circuit HSG are provided in common to respective word lined drivers provided for word line 3 (word lines WL0-WLn). The operation of each circuit shown in FIG. 27 will be described hereinafter.

First, the operation of high voltage generation circuit HVG will be described with reference to FIG. 28 which is an operation waveform diagram thereof. A repetitive signal $\phi c$ applied to node 28 is generated from an on-chip or external oscillation circuit utilizing ring oscillation. The signal $\phi c$ is assumed to be a pulse signal having a predetermined period and pulse width.

When internal operating power supply voltage Vcc is applied to internal operating power supply voltage terminal 8, the potentials of nodes 32 and 35 are charged to the potential level of Vcc -VTN by charging n-FET 29. Here, VTN is the threshold voltage of n-FET 29. By rectifying n-FET 30, the potential level of node 27 is charged to the potential level of Vcc- 2·VTN.

The provision of repetitive signal $\phi c$ to node 28 causes initiation of a boosting operation in high voltage generation circuit HVG. For the sake of simplification, it is assumed that the boosting operation in high voltage generation circuit HVG is initiated after the potential level of node 32 and output node 27 are stabilized to the above-described potential levels of Vcc-VTN and Vcc-2·VTN.

When repetitive signal $\phi c$ rises after the potentials of node 32 and output node 27 attain the level of Vcc-VTN and Vcc-2·VTN, respectively, charge is introduced to node 35 via boosting capacitor 31. Therefore, the potential of node 35 rises. This potential rise of node 35 causes charge to be provided to output node 27 via n-FET 30, whereby potential V27 of output node 27 is raised by:

$$\Delta V27 = C31 \cdot Vcc/(C31+C33)$$

Here, C31 represents the capacitance value of boosting capacitor 31, and C33 represents the capacitance value of stabilizing capacitor 33.

When repetitive signal $\phi c$ falls, the potential of node 32 (node 35) is decreased due to capacitive coupling by boosting capacitor 31. However, because n-FET 30 has the gate and drain connected to serve as a diode, it enters a non-conducting state, and potential V27 of output node 27 is not decreased and maintains the potential boosted at the time of the prior rise of repetitive signal $\phi c$. In response to the fall of repetitive signal $\phi c$, the potentials of nodes 32 and 35 are charged by n-FET 29 to be restored to the level of Vcc-VTN.

By repeating the above-described operation, charges are injected into nodes 32 and 35 via boosting capacitor 31. Charge is introduced to output node 27 via n-FET 30 every time the potential thereat rises. As a result, the potential of output node 27 gradually rises.

The eventual potential V32max of node 32 (node 35) is as follows:

$$V32max = (Vcc-VTN) + C31 \cdot Vcc/(C31+C34)$$

where C34 represents the capacitance value of parasitic capacitance 34. Here, potential V27 of output node 27 attains a value lower by the threshold voltage VTN of n-FET 30 than the potential V32 (=V35) of node 32 (node 35). More specifically, the eventual potential V27max of output node 27 is as follows:

$$V27max = V32max - VTN$$

$$= (Vcc-2 \cdot VTN) + C31 \cdot Vcc/(C31+C34)$$

In practice, capacitance value C31 of boosting capacitor 31 can easily be made high enough in comparison with capacitance value C34 of parasitic capacitance 34. Therefore, the third term in the above two equations are approximately equal to internal operating power supply voltage Vcc. Suppose Vcc=3.3 V, and VTN=0.8 V, the potential V27max of output node 27 is as set forth in the following from the above equation.

$$V27max = 2(Vcc-VTN) = 5.0(V)$$

More specifically, potential V27max of output node 27 is approximately 1.5 times the internal operating power supply voltage Vcc. This high voltage is stabilized by a stabilizing capacitor 33 having a great capacitance value.

The operation of a word line driving signal generation circuit and a word line driver will be described with reference to FIG. 29 which is a waveform diagram thereof.

At time t0 when control signal $\phi x0$ attains a L level (logical low), n-FET 24 is turned off and n-FET 21 is turned on by inverter circuit 26. Therefore, the potential of node 22 attains the L level of ground potential, and the potential of node 25 attains the level of high voltage Vpp applied to node 17 via p-FET 23. When the potential of node 25 attains the level of high voltage Vpp, p-FET 20 is completely turned off, so that the potential of node 22 is reliably discharged to the level of ground potential via n-FET 20. The potential of word line driving signal $\phi x$ reliably attains the level of ground potential.

In word line driver WDi, the output potential (the potential of node 9) of X decoder ADXi attains a L level (ground potential level), whereby n-FET 12 and n-FET 11 are turned on and off, respectively. As a result, the potential level of word line driving signal $\phi xi$ on word line 3 attains the L level of ground potential.

Next, when row address strobe signal /RAS (refer to FIG. 25) falls to a L level, a row selecting operation is initiated. In response to the fall of row address strobe signal /RAS, X decoder ADX (refer to FIG. 25) executes a row selecting operation. Here, it is assumed that (unit) X decoder ADXi shown in FIG. 27 is selected.

At time t1 when the potential level of node 9 rises to the level of internal power supply voltage Vcc, the output of inverter circuit 16 of word line driver WDi attains a L level of ground potential, whereby n-FET 12 is turned off from an on state. Also, node 15 is charged from node 9 via n-FET 14 to increase in potential. Between nodes 9 and 15, n-FET 14 is provided having the gate connected to power supply voltage node 8 supplying internal operating power supply voltage Vcc. Therefore, the potential level of node 15 rises to the potential level of Vcc-VTN. Here, VTN is the threshold voltage of n-FET 14. Therefore n-FET 11 is turned on, and word line 3 is discharged via n-FET 11 and n-FET 21 to maintain the level of ground potential.

When the potential level of node 9 is stabilized, control signal $\phi x0$ applied to node 19 rises to the H level at time t2. In response to the fall of row address strobe signal /RAS control signal $\phi x0$ rises to the level of internal operating power supply voltage Vcc after a predetermined time. The rise of control signal $\phi x0$ to the level of internal operating power supply voltage Vcc causes n-FET 24 to be turned on and n-FET 21 to be turned off. As a result, node 25 is discharged to the level of ground potential by n-FET 24. In response, p-FET 20 is turned on to raise the potential of node 22. Eventually, when p-FET 23 is turned off and node 25 falls to the level of ground potential, the potential level of node 22 attains the level of high voltage Vpp applied to node 17 via p-FET 20. As a result, a word line driving signal $\phi x$ is generated.

When word line driving signal $\phi x$ of the level of high voltage Vpp is applied to node 10 in word line driver WDi, the potential level of node 15 rises by the voltage change of node 10 (by high voltage Vpp) due to the self bootstrap function of n-FET 11 (by the capacitive coupling between the gate and drain of n-FET). As a result, the potential level of node 15 becomes Vcc-VTN+Vpp, i.e. exceeds Vpp+VTN. Therefore, there is no loss of the threshold voltage in n-FET 11, and the potential level of word line driving signal $\phi xi$ transmitted on word line 3 rises to the level of high voltage Vpp.

The rise of word line driving signal φxi transmitted to word line 3 up to the level of high voltage Vpp causes the selecting transistor 5 in memory cell 1 to attain a deep on state rapidly. Therefore, the charge stored in memory capacitor 6 is transmitted on bit line 2 without loss of the threshold voltage of selecting transistor (n-FET) 5.

Then, the sensing operation of the sense amplifier is carried out, followed by reading or writing of data of a selected memory cell.

When one memory cycle is completed, control signal φx0 falls to the L level and the output of X decoder ADXi also falls to the L level at time t3. The potentials of each signal and node are restored to the state of time t0.

The charging operation of word line 3, i.e. potential increase thereof, will be described in detail hereinafter.

The charging operation of word line 3 is realized by the transfer of charge from stabilizing capacitor 33 in high voltage generation circuit HVG to parasitic capacitance 7 of word line 3. Therefore, the potential level of output node 27 of high voltage generation circuit HVG is slightly reduced since charge is transferred to word line 3 at the time of word line selection. However, if the capacitance value of stabilizing capacitor 33 is set to a value sufficiently greater than the capacitance value of parasitic capacitance 7 of word line 3, there is almost no decrease in the potential level of output node 27. Therefore, the potential level of a selected word line can maintain the level of high voltage Vpp.

Because the potential level V(WL) of word line 3 can be obtained by:

$$V(WL) = C33 \cdot Vpp / (C33 + C7)$$

the potential level on word line 3 can take the level of high voltage Vpp if the capacitance value C7 of parasitic capacitance 7 is small enough to be neglected in comparison with the capacitance value C33 of stabilizing capacitor 33.

From the standpoint of high density and high integration density, stabilizing capacitor 33 must have superior space efficiency that can realize a relatively high capacitance value with a small occupying area. A MOS capacitor utilizing an insulating gate type field effect transistor is generally employed as such capacitors.

FIG. 30 is a MOS capacitor wherein (A) shows a sectional view thereof, (B) shows an electrical connection circuit thereof, and (C) shows an electrical equivalent circuit thereof.

Referring to FIG. 30 (A), a MOS capacitor includes N type impurity regions 102a and 102b formed at a predetermined region on a P type semiconductor substrate 101, a gate insulating film (capacitor insulating film) 104 formed on the surface of semiconductor Substrate 101, and a gate electrode 103 formed on gate insulating film 104. Impurity regions 102a and 102b provide one electrode leading portion of the capacitor (in FIG. 30 (A), the electrode leading portion connected to ground potential GND, i.e. ground line). Gate electrode 103 implements the other electrode of the capacitor, and is formed of polycrystalline silicon, refractory metal silicide such as molybdenum silicide or tungsten silicide, or a multilayer structure of polycrystalline silicon and refractory metal silicide.

Gate electrode 103 is connected to output node 27 receiving high voltage Vpp. The power supply and ground lines between gate electrode 103 and output node 27 are formed of a low resistance metal such as aluminum. Gate insulating film 104 is formed using an insulating film such as silicon dioxide ($SiO_2$) film. The source and drain electrode 108 is formed of a low resistance conductor such as aluminum to provide electrical contact with impurity regions 102a and 102b. Ground potential GND from the ground line is applied to impurity regions 102a and 102b.

An interlayer insulating film 109 is provided to electrically insulate the electrodes 103 and 108 from each other.

When a voltage exceeding the threshold voltage is applied to gate electrode 103, an inversion layer (N type inversion layer) 101 is formed at the surface of semiconductor substrate 101. This inversion layer 101 forms one electrode of the capacitor. More specifically, in the MOS capacitor shown in FIG. 30(A), one electrode of the capacitor is inversion layer 101, and the other electrode is gate electrode 103. Ground potential GND is applied to inversion layer 101 via impurity region 102. When connection of one electrode to ground potential GND is realized and high voltage Vpp is applied to the other electrode (gate electrode 103), this capacitor functions as the stabilizing capacitor shown in FIG. 27.

A MOS capacitor has a structure identical to a MOS transistor (insulating gate type field effect transistor) used within a memory chip. It can be regarded as a MOS transistor having the source electrode and the drain electrode connected in common to ground potential GND (refer to FIG. 30(B) and (C)).

A capacitor of a MOS structure shown in FIG. 30(A) is used because the thickness of a dielectric film (capacitor insulating film) can be reduced. It also has the advantage of forming a capacitor with superior space efficiency by using an empty region of a nearby circuit.

In a general dynamic random access memory, the potential of a selected word line is required to be a level of approximately 1.5 times the internal operating power supply voltage (to be more precise, the potential level corresponding to the data of the high level written in the memory cell) in order to increase the speed of reading data from a memory cell and writing data of a sufficient potential level to a memory cell.

The FET (insulating gate type field effect transistor) used in a dynamic random access memory has the thickness of the gate insulating film determined depending upon performance of its operation speed and stability. For example, when the operating power supply voltage is 3.3 V, the gate insulating film of a FET is set to approximately 100 Å.

In this case, the electric field E applied to the gate insulating film is:

$$E = V/t = 3.3 \cdot 1.5 / 100 = 5 \cdot 10^6 [V/cm]$$

An electric field sufficiently lower than the dielectric breakdown voltage of $10 \cdot 10^6$ V/cm is applied to the gate insulating film. Thus, reliability of a gate insulating film is ensured.

An operation lifetime test was carried out on such dynamic random access memories. It was found out that the life time of a dynamic random access memory with an operating power supply voltage of 3.3 V is shorter than that of a dynamic random access memory with an operating power supply voltage of 5 V. The operation life time test for a 3.3 V dynamic random access memory was carried out under the conditions of an ambient temperature of 125° C., and internal operating power supply voltage Vcc of 5 V (Vpp = 5×1.5 = 7.5 (V)), and an operating time period of 1000 hours. The operation life time test for a 5 V dynamic random access memory was carried out under the conditions of an ambient temperature of 125° C., an internal operating power supply voltage Vcc of 7.5 V (Vpp = 7.5×1.5 = 11.25 (V)).

Then, the operating conditions were set to a more severe level. An accelerated operation life test was carried out in which an operation life time test of 1000 hours corresponds to that of 1500 hours. Although there was little difference in the defective rate of DRAMs having Vcc of 3.3 V and 5.0 V in an operation life test of a general standard, there were cases where the defective rate of a dynamic random access memory with an operating power supply voltage of 3.3 V was higher than that of a dynamic random access memory with an operating power supply voltage of 5 V in the accelerated operation life time test.

This cause was traced to the fact that dielectric breakdown occurred in the capacitor used for high voltage stabilization, resulting in short circuit between the high voltage output node and ground potential, to prevent a high voltage from being generated in stability. Such dielectric breakdown is considered to be caused by an electric field greater than the tolerable value being applied due to variation in the thickness of the gate insulating film in the manufacturing process. Even if the reference value of variation in the film thickness is 5 Å, a thinner film will suffer a greater effect.

In a dynamic random access memory, the size of a FET is reduced for the sake of high density, high integration density, and low cost even if the operating power supply voltage is the same 3.3 V. Accordingly, the thickness of the gate insulating film is further reduced to 90 Å, 80 Å, etc. Therefore, the insulation characteristics of a capacitor for high voltage stabilization must be improved.

Even if instantaneous dielectric breakdown due to application of a high electric field does not occur, it is known that fatigue failure of an insulating film (time dependent dielectric breakdown: TDDB) due to stress of an electric field application over a long time will occur. There is a possibility of dielectric breakdown even when an electric field that does not induce dielectric breakdown is applied. Thus, reliability of the insulating characteristics of a capacitor for high voltage stabilization must be ensured.

Such problem of insulating characteristics not only in a stabilizing capacitor, but also in a MOS transistor, is not limited to a semiconductor memory device, and is also seen in integrated circuit devices utilizing high voltage.

SUMMARY OF THE INVENTION

An object of the present invention is to improve dielectric breakdown voltage characteristics of a component.

Another object of the present invention is to provide a semiconductor memory device including a stabilizing capacitor that can generate a high voltage for driving a word line in stability.

A further object of the present invention is to improve reliability of a capacitor for stabilizing high voltage for driving a word line.

Still another object of the present invention is to provide a semiconductor integrated circuit device including a high voltage generation circuit for generating a high voltage stably within a chip.

A semiconductor memory device according to the present invention utilizes a series of a plurality of capacitive elements as a capacitor for stabilizing a word line driving high voltage, or a FET having an increased dielectric breakdown voltage for preventing electrostatic breakdown and included in an input/output circuit connected directly to an external terminal.

The series of capacitive elements of the present invention reduce the electric field applied to each capacitive element due to capacitance-division, whereby reliability of a capacitive element is ensured in applying high voltage. Thus, a high voltage stabilizing capacitor of high reliability can be realized.

The foregoing and other objects, features, aspects and advantages of the present invention will become more apparent from the following detailed descriptions of the present invention when taken in conjunction with the accompanying drawings.

DESCRIPTION OF THE PREFERRED EMBODIMENTS

Figure 1:
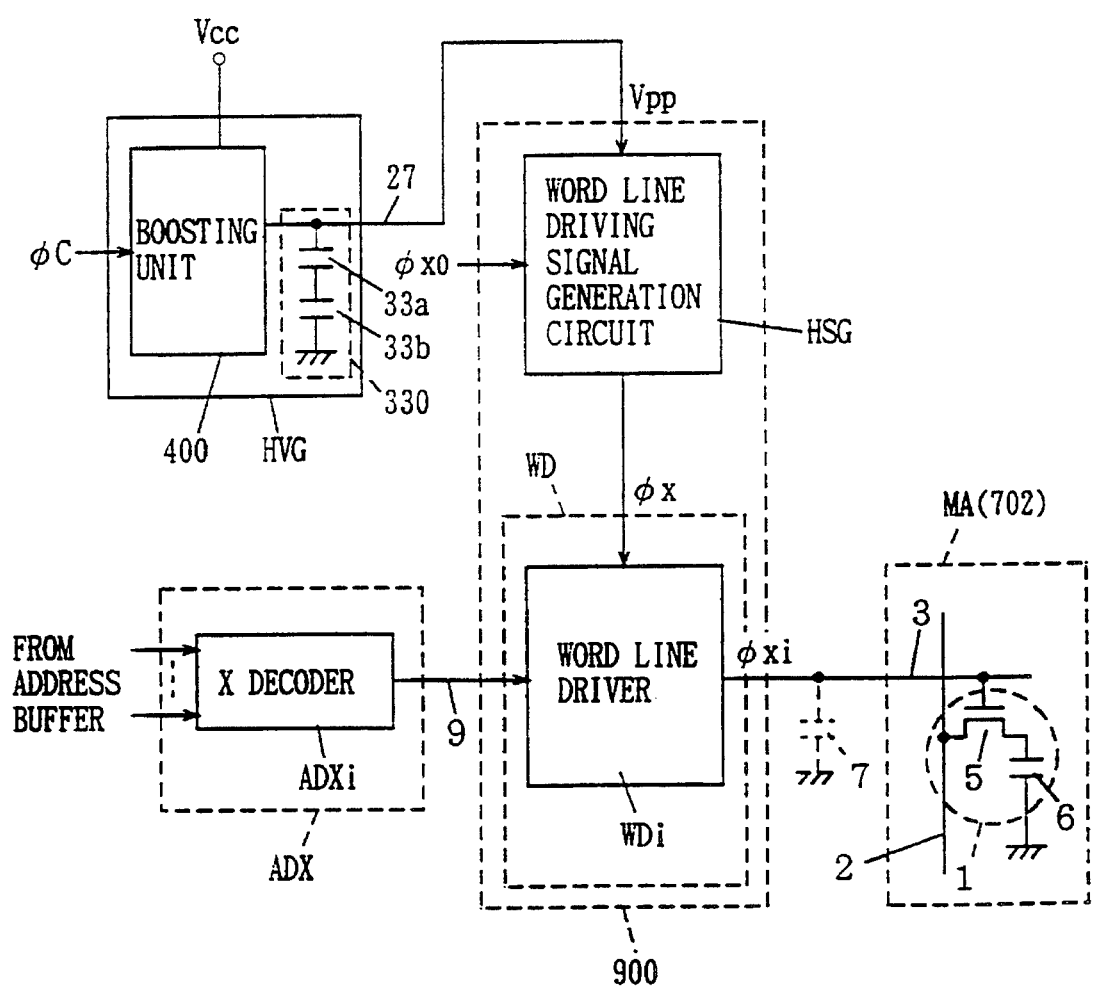
FIG. 1 shows a structure of the main components of a semiconductor memory device according to an embodiment of the present invention.
Figure 27:
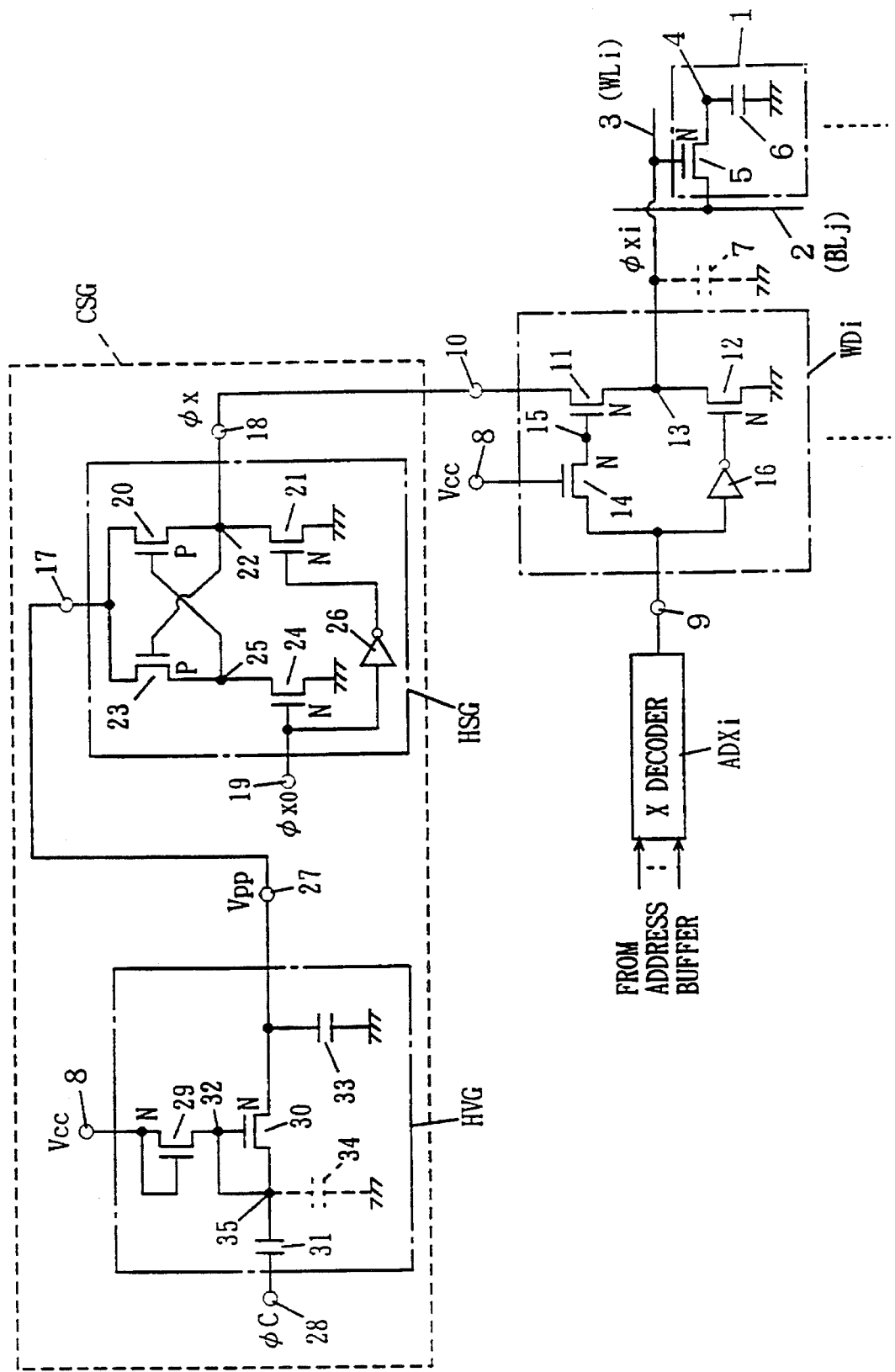
FIG. 27 shows the structure of the portion associated with one word line in a conventional semiconductor memory device.
Figure 28:
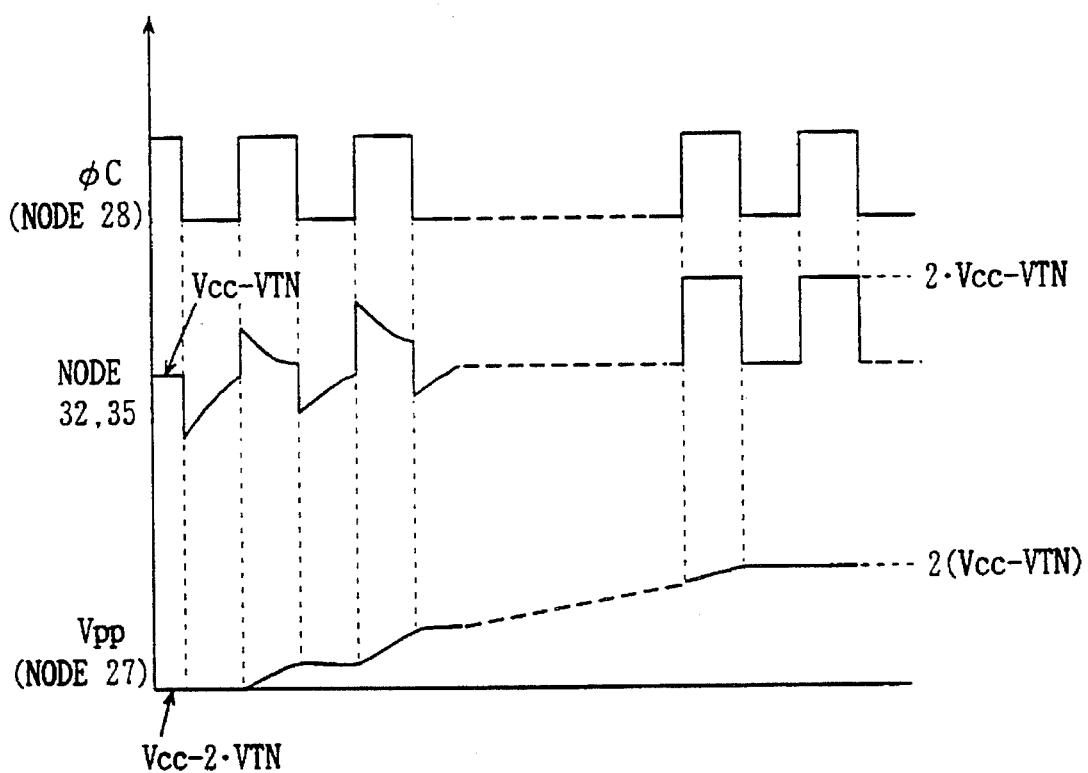
FIG. 28 is a signal waveform diagram showing the operation of the high voltage generation circuit of FIG. 27.
Figure 29:
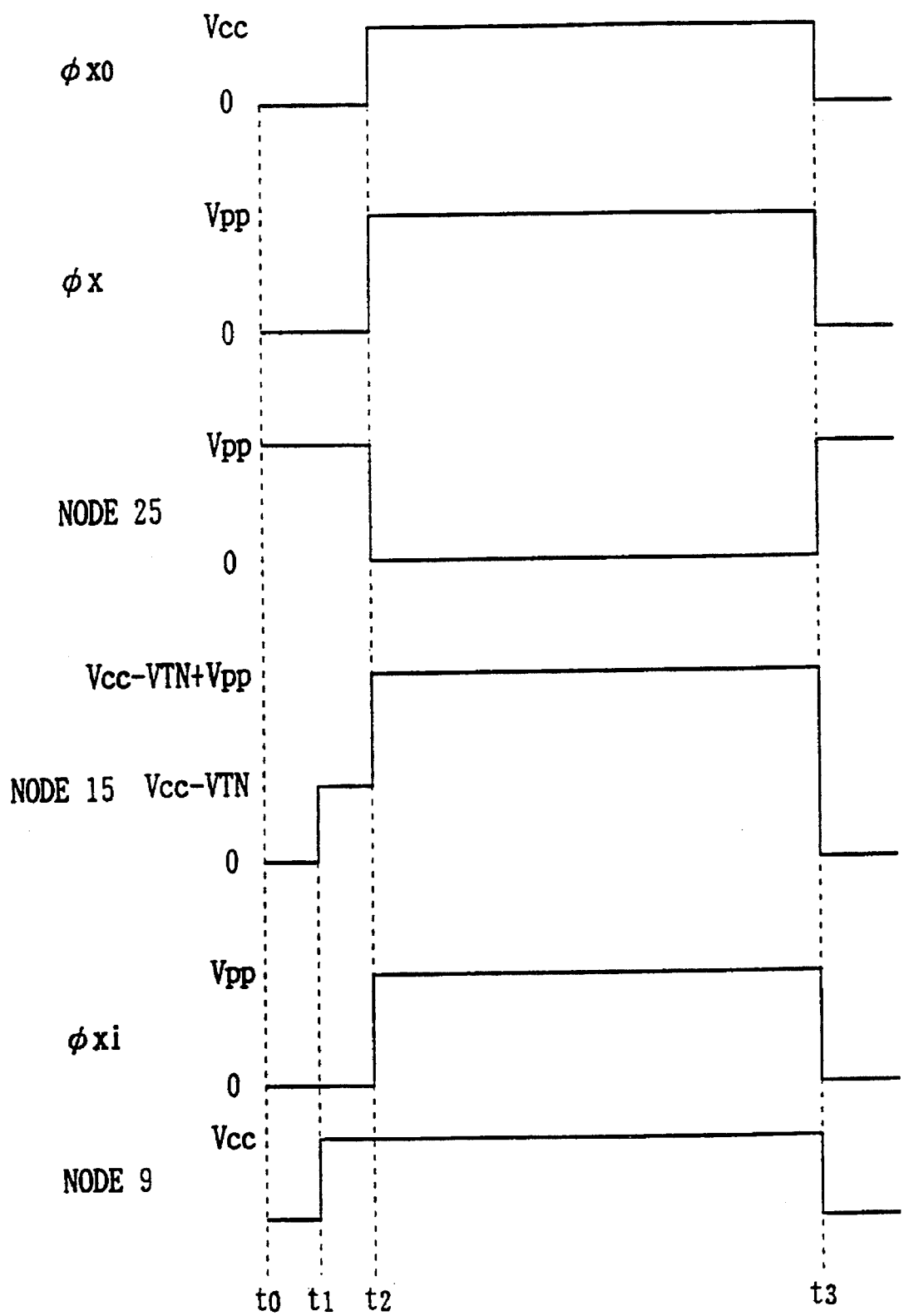
FIG. 29 is a signal waveform diagram showing the operation of the word line driving signal generation circuit of FIG. 27.
Figure 30A:
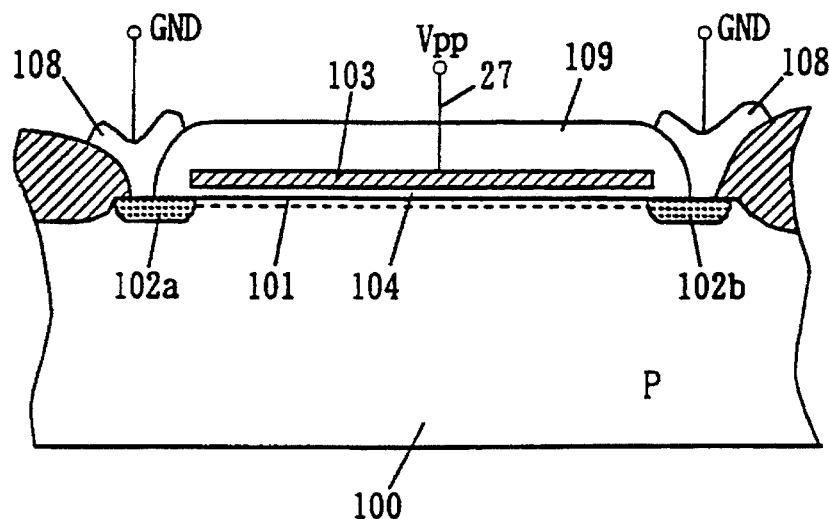
FIG. 30a, 30b and 30c shows a structure, a connection structure, and an electrical equivalent circuit of the stabilizing capacitor of FIG. 27.
Figure 30B:
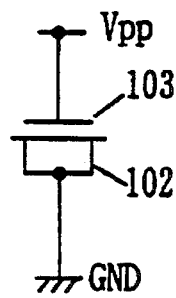
Figure 30C:
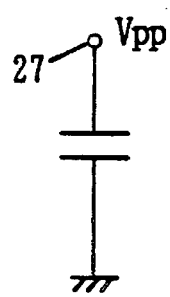

FIG. 1 shows a structure of the main components of a semiconductor memory device according to an embodiment of the present invention. Referring to FIG. 1, a word line driving signal generation circuit HSG, a (unit) X decoder ADXi, and a word line driver WDi have structures similar to those shown in FIG. 27. Corresponding components have the same reference characters allotted thereto, and their description will not be repeated. Word line driving signal generation circuit HSG and word line driver circuit WDi (word line driver circuit WD) form a word line driving means 900 for driving a selected word line. Similar to the structure of FIG. 27, one word line 3, one bit line 2, and a memory cell 1 are shown in FIG. 1. Memory cell 1 includes one selecting transistor 5 and a memory capacitor 6.

A high voltage generation circuit HVG for generating a boosted word line driving signal includes a boosting unit 400 responsive to a repetitive signal φc for generating a high voltage Vpp from an internal operating power supply voltage Vcc, and a stabilizing capacitor 330 for stabilizing a high voltage generated by boosting unit 400. Stabilizing capacitor 330 includes a plurality (2 in FIG. 1) of capacitive elements 33a and 33b connected in series between output node 27 of boosting unit 400 and a second power supply voltage (ground potential). Boosting unit 400 includes a boosting capacitor and two diode-connected n-FETs in high voltage generation circuit HVG of FIG. 27. More specifically, boosting unit 400 responds to repetitive signal φc to generate a high voltage Vpp by a charge pumping operation.

In stabilizing capacitor 330, voltages V33a and V33b applied across capacitive elements 33a and 33b, respectively, are as follows:

$$V33a = C33b \cdot Vpp/(C33a+C33b)$$

$$V33b = C33a \cdot Vpp/(C33a+C33b)$$

where the high voltage generated to node 27 is Vpp, and C33a and C33b represent the capacitance values of capacitive elements 33a and 33b. Therefore, if capacitance value C33a equals capacitance value C33b, the voltages applied across capacitive elements 33a and 33b become ½ (=Vpp/2), as compared to the stabilizing capacitor formed by one capacitor shown in FIG. 27. Therefore, the voltage applied to each capacitive element is greatly reduced even if the capacitor insulating film is thin. The insulating characteristics (dielectric breakdown voltage and time dependent dielectric breakdown) of stabilizing capacitor 33 is greatly improved. Thus, a stabilizing capacitor of high reliability can be realized to generate a high voltage Vpp in stability.

The capacitance value of stabilizing capacitor 330 is set to a threshold value sufficiently greater than the capacitance value of parasitic capacitance 7 of word line 3. Preferably, the capacitance value of stabilizing capacitor 330 is set to approximately 30 times the parasitic capacitance 7 taking into consideration the occupying area of stabilizing capacitor 330 and the charging speed (charging time) of output node 27 in generating high voltage Vpp. For example, in a 4M dynamic random access memory, the capacitance value of parasitic capacitance 7 is approximately 10 pF, and the capacitance value C330 of stabilizing capacitor 330 is set to approximately 300 pF.

Because capacitive elements 33a and 33b are connected in series, capacitance values C33a and C33b of capacitive elements 33a and 33b must be greater than capacitance value C330 of stabilizing capacitor 330. Therefore, capacitive elements 33a and 33b must employ an element structure of superior space efficiency.

Figure 2:
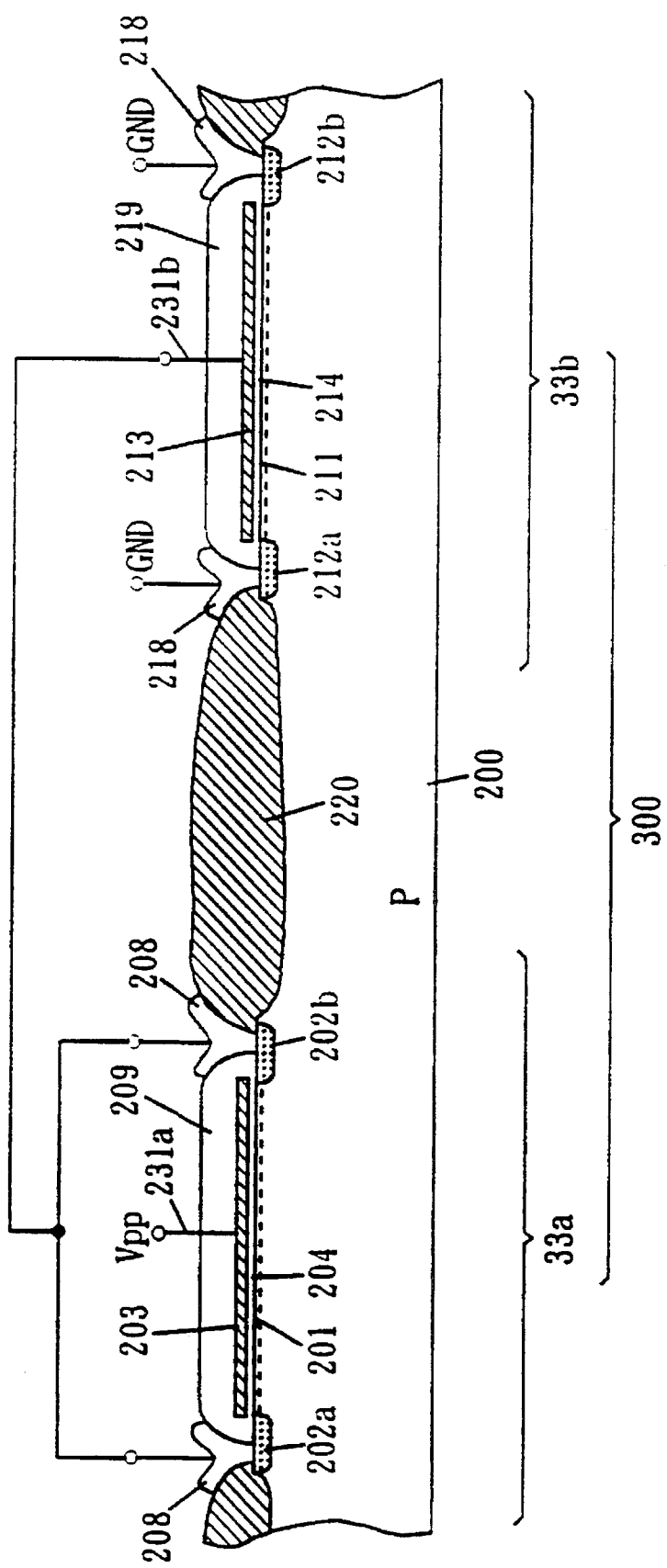
FIG. 2 shows a specific structure of a stabilizing capacitor shown in FIG. 1.

FIG. 2 shows a structure of the stabilizing capacitor shown in FIG. 1. The stabilizing capacitor of FIG. 2 has a MOS capacitor structure using an n-FET. Capacitive elements 33a and 33b are isolated by a cell isolation film (field oxide film) 220 formed on the surface of a p type semiconductor substrate 200.

Capacitive element 33a includes n type impurity regions 202a and 202b formed at a predetermined region on the surface of a p type semiconductor substrate 200, and a gate electrode 203 formed between impurity regions 202a and 202b on the surface of semiconductor substrate 200 with a gate insulating film 204 thereunder. An electrode leading layer 208 is provided on impurity regions 202a and 202b. An electrode leading layer 231a is provided on gate electrode 203.

Similar to capacitive element 33a, capacitive element 33b includes n type impurity regions 212a and 212b, and a gate electrode 213 formed on the surface of semiconductor substrate 200 with a gate insulating film 214 therebetween. An electrode leading layer 218 is provided for impurity regions 212a and 212b. An electrode leading layer 231b is provided for gate electrode 213.

Impurity regions 202a and 202b of capacitive element 33a is connected to gate electrode 213 of capacitive element 33b via electrode leading layers 208 and 231b. Gate electrode 203 of capacitive element 33a is connected to receive high voltage Vpp via electrode leading layer 231a. Impurity regions 212a and 212b of capacitive element 33b are connected to receive ground potential GND via electrode leading layer 218.

By forming a stabilizing capacitor using an insulating gate type field effect transistor as shown in FIG. 2, a stabilizing capacitor can be manufactured in the same common manufacturing process as that of the insulating gate type field effect transistor used in this semiconductor memory device. Therefore, a capacitor superior in space efficiency and film thickness controllability can be obtained without additional manufacturing steps. Even if there is variation in thickness of the gate insulating film in the manufacturing process, a stabilizing capacitor superior in insulating characteristics can be realized since the voltage applied to each of capacitive elements 33a and 33b can be set to a sufficiently low voltage due to capacitance-division.

Figure 3:
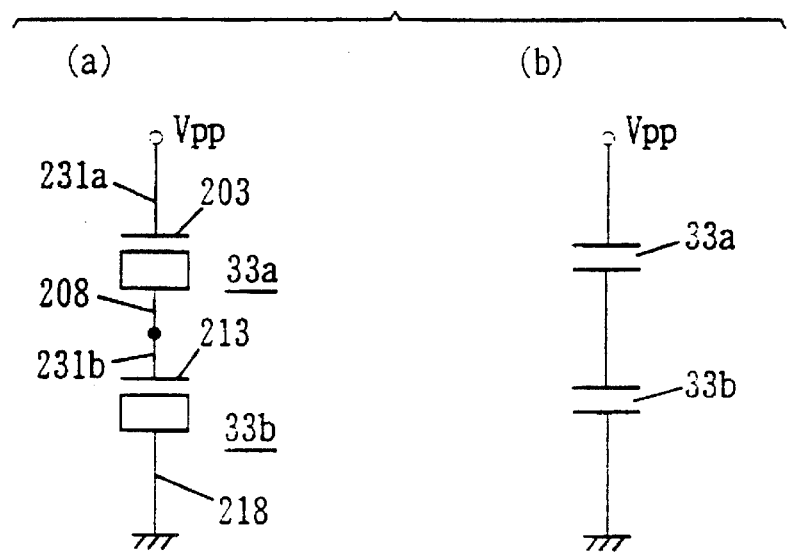
FIG. 3 shows a connection structure and an electrical equivalent circuit of the capacitive element shown in FIG. 2.

FIG. 3 shows the connection structure and electrical equivalent circuit of the stabilizing capacitor of FIG. 2. Referring to FIG. 3(a), gate electrode 203 of capacitive element 33a is connected to high voltage Vpp. The impurity regions of capacitive element 33a are coupled together to gate electrode 213 of capacitive element 33b. The impurity regions of capacitive element 33b are both connected to ground potential via electrode leading layer 218. This means that the capacitance shown in FIG. 3(b) is electrically equivalent to the serial-connected structure between high voltage Vpp and ground potential GND.

In the structure shown in FIG. 2, a MOS capacitor is realized using an n-FET. Alternatively, a p-FET can be used.

Figure 4A:
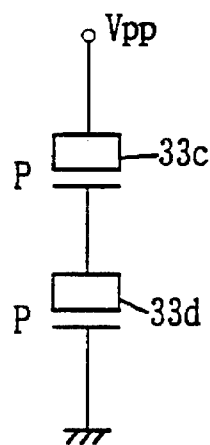
FIGS. 4A–4C show other structures of a stabilizing capacitor of FIG. 1.

Referring to FIG. 4A, a stabilizing capacitor includes capacitive elements 33c and 33d formed using p-FETs connected in series between high voltage Vpp and ground potential. Capacitive element 33 has its impurity region connected to high voltage Vpp, and the gate electrode connected to the impurity region of capacitive element 33d. Capacitive element 33d has the gate electrode connected to ground potential. A semiconductor memory device of the invention utilizes a p-FET (for example, an inverter circuit of a CMOS structure). Therefore, capacitive elements 33c and 33d can be manufactured according to a manufacturing process common to a p-FET manufacturing process in a semiconductor memory device.

Figure 4B:
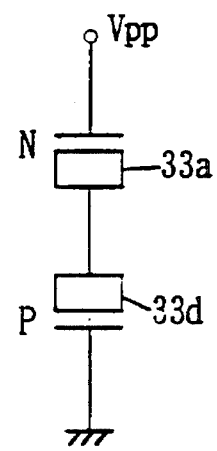

Referring to FIG. 4B, a stabilizing capacitor includes a capacitive element 33a formed using an n-FET, and a capacitive element 33d formed using a p-FET. Capacitive element 33a has the gate electrode connected to high voltage Vpp and the impurity region connected to the impurity region of capacitive element 33d. Capacitive element 33d has the gate electrode connected to ground potential.

Figure 4C:
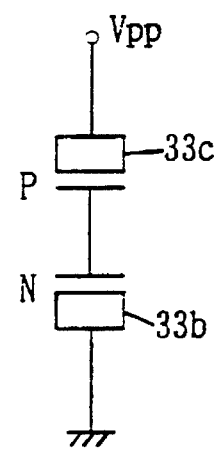

The stabilizing capacitor shown in FIG. 4C includes a capacitive element 33c formed using a p-FET, and a capacitive element 33b formed using an n-FET. Capacitive element 33c has the impurity region connected to high voltage Vpp, and the gate electrode connected to the gate electrode of capacitive element 33b. Capacitive element 33b has the impurity region connected to ground potential.

Equivalent circuits of the stabilizing capacitors of FIGS. 4A to 4C are similar to that shown in FIG. 3(b). A stabilizing capacitor can be realized using capacitors connected in series, whereby the voltage applied across each of capacitive elements 33a–33d can be reduced to realize a stabilizing capacitor superior in insulation characteristics. When a stabilizing capacitor is to be provided using both a p-FET and an n-FET, it can be formed by a manufacturing process common to that of the CMOS circuitry of the semiconductor memory device. A stable capacitive element can be realized without additional manufacturing step.

As described above, FET having a structure identical to that of FET used in the semiconductor memory device (identical gate insulating film thickness) is used for a capacitive element for high voltage stabilization. In other words, the capacitive elements 33a and 33b (33c and 33d) and a FET in the semiconductor memory device can be formed by the same manufacturing process. This manufacturing process will be described hereinafter briefly.

Figure 5:
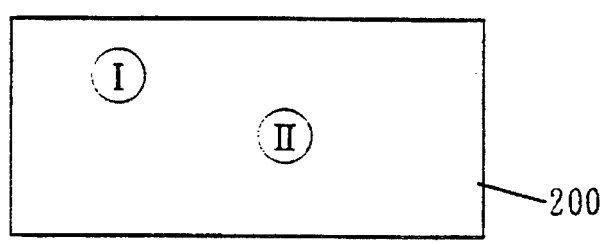
FIG. 5 is a diagram for describing a method of manufacturing the capacitive element of FIG. 1.

A case is considered where a FET is to be formed on regions I and II of a semiconductor chip 200 as shown in FIG. 5. A capacitive element for high voltage stabilization is to be formed in region I. An FET of other circuitry is to be formed in region II. Here, a case is considered where an n-FET is to be formed in each of regions I and II.

Figure 6:
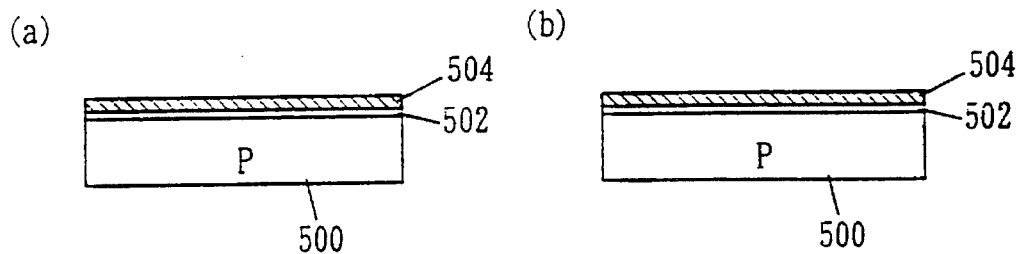
FIGS. 6–16 show manufacturing steps of the capacitive element of FIG. 1.

Referring to FIGS. 6(a) and (b), a thin thermal oxide film (pad oxide film) 502 is grown on the surface of a p type semiconductor substrate 500. Then, a silicon nitride film 504 is deposited by CVD (Chemical Vapor Deposition) to form a two-layer insulating film. FIG. 6 (a) shows the FET formation process in region I, and FIG. 6 (b) shows the FET formation process in region II. In the following description, (a) shows the formation process of a capacitive element for stabilization capacitance, and (b) shows the FET formation process of other circuitry in each figure.

Figure 7:
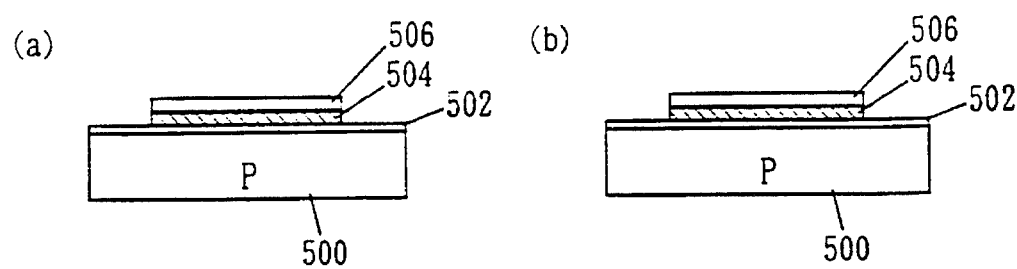

Referring to FIG. 7(a) and (b), following the formation of a resist film, patterning of this resist film is carried out using photolithography technique to form a resist pattern 506. Using resist pattern 506 as a mask, silicon nitride film 504 formed on a region to be an element isolation region is removed by etching.

Figure 8:
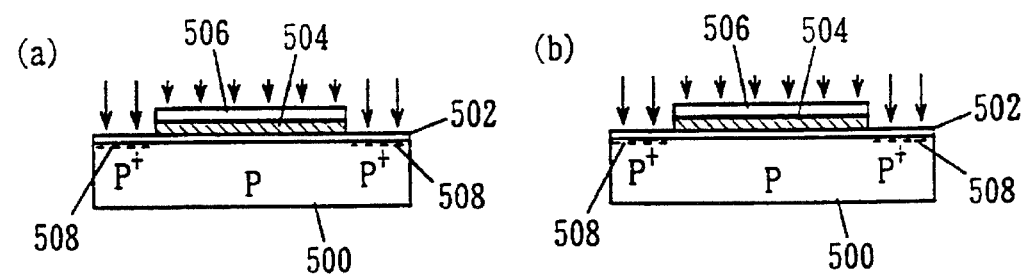

As shown in FIG. 8, p type impurities such as boron are implanted onto the surface of the element isolation region in semiconductor substrate 500 using resist pattern 506 as a mask to form an ion implanted region 508 as a channel stopper in order to set the threshold voltage of a parasitic MOSFET greater than a predetermined value. Here, a parasitic MOSFET indicates a parasitic FET ascribed to a MOS structure formed of an interconnection material, a field oxide film, and a semiconductor substrate. Isolation between elements must be ensured by setting a high critical voltage, i.e. threshold voltage by which the parasitic MOSFET conducts. Ion implantation for channel stopper is carried out for this purpose.

Figure 9:
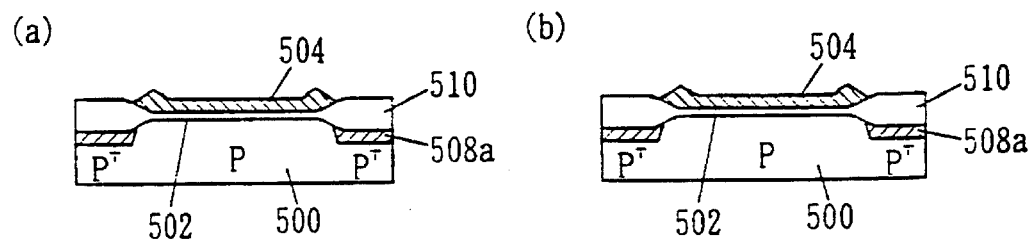

Referring to FIG. 9, after resist pattern 506 is removed, thermal oxidation is carried out with silicon nitride film 504 as a mask to grow a thick silicon dioxide film (field oxide film) 510 selectively at the element isolation region. Such a field oxidation method is called LOCOS (Local Oxidation of Silicon). Here, a field oxide film 510 is also grown beneath silicon nitride film 504, whereby silicon nitride film 504 is partially raised (birds beak). During this growth of field oxide film 510, channel stopper impurity implanted region 504 is diffused and activated, whereby a channel stopper region 508a is formed beneath field oxide film 510. By this series of manufacturing steps, element isolation is completed.

Figure 10:
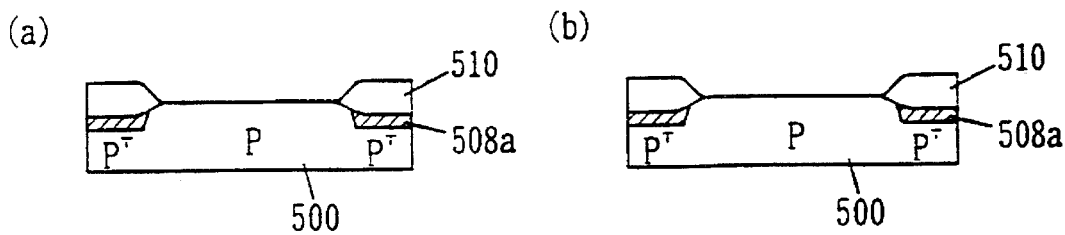

Referring to FIG. 10, silicon nitride film 504 and pad oxide film 502 no longer required are removed by etching to expose the surface of semiconductor substrate 500.

Figure 11:
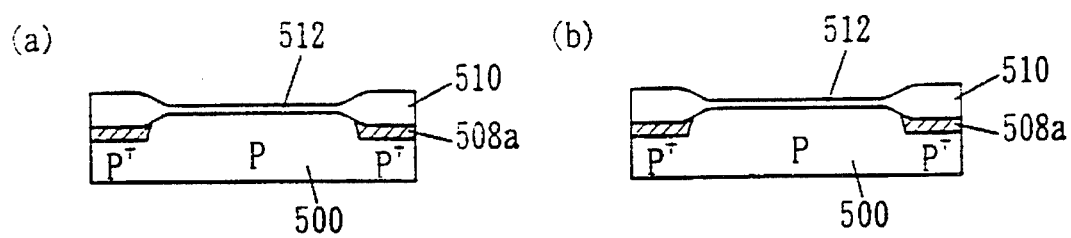

Referring to FIG. 11, thermal oxidation is carried out on the exposed portion of the surface of the semiconductor substrate 500 to grow a thin gate oxide film 512. Careful attention is paid to the control of the film thickness and the film quality of gate oxide film 512 since they exert a great effect on the threshold voltage of the MOSFET.

Figure 12:
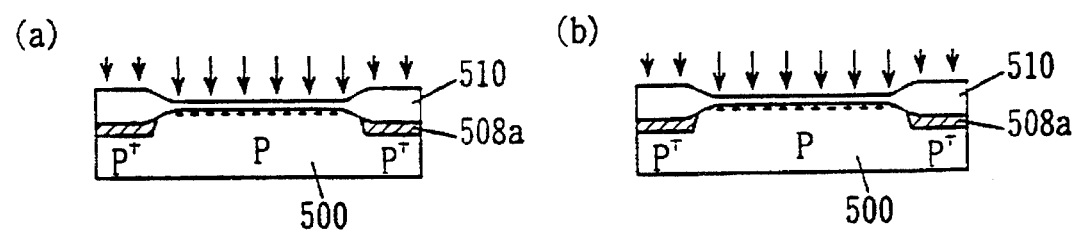

Referring to FIG. 12, ion implantation of p type impurities such as boron is carried out to set the threshold voltage of the MOSFET to a predetermined value. The ion implantation shown in FIG. 12 is directed to control the threshold voltage of the FET. When a transistor of a different threshold voltage is to be formed, ion implantation of p type or n type impurities is carried out only for a desired FET using a resist as a mask.

Figure 13:
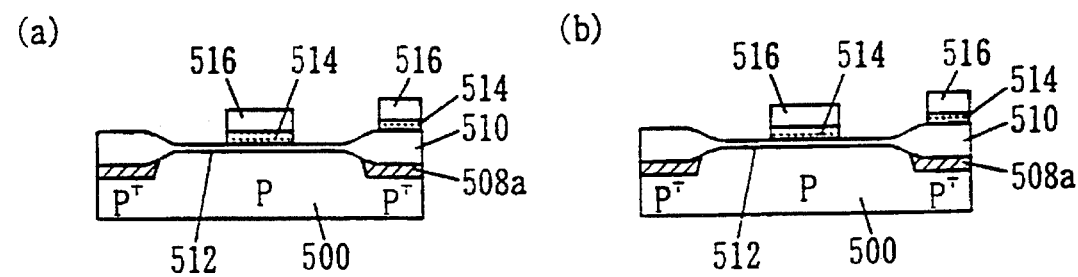

Referring to FIG. 13, n type polycrystalline silicon is deposited all over the surface by, for example, CVD. Using resist pattern 516 as a mask, this polycrystalline silicon is etched to form a gate electrode 514. A layer of refractory metal silicide such as molybdenum silicide or tungsten silicide may be used as the material of the gate electrode instead of polycrystalline silicon layer 514.

Figure 14:
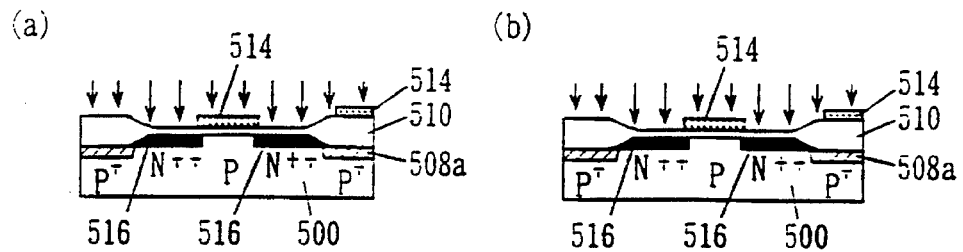

Referring to FIG. 14, following the removal of resist pattern 514, n type impurities (such as phosphorus or arsenic) of high concentration are ion-implanted in self-alignment using gate electrode layer 514 and field oxide film 510 as a mask. Then, heat treatment is applied to electrically activate the implanted ions, whereby source and drain regions 516 are formed. As a result, the basic structure of a MOSFET is formed.

The polysilicon layer formed above field oxide film 510 is another interconnection layer. It is formed by the same process of gate electrode layer 514. Such interconnection layer include, for example, a word line in a memory cell array.

Figure 15:
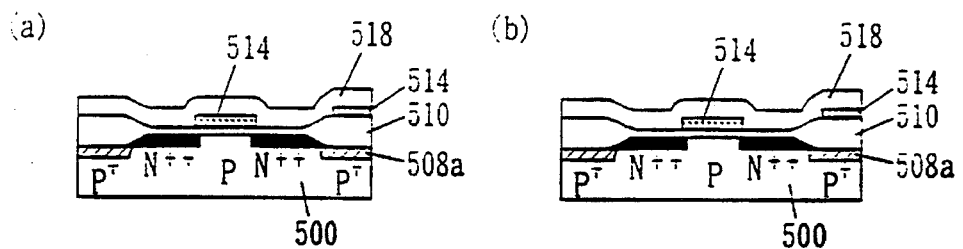

Referring to FIG. 15, a PSG film (Phospho Silicate Glass film) 518 is grown by CVD to form an interlayer insulating film. Then, a reflow process is applied to PSG film 518 to planarize the surface thereof.

Figure 16:
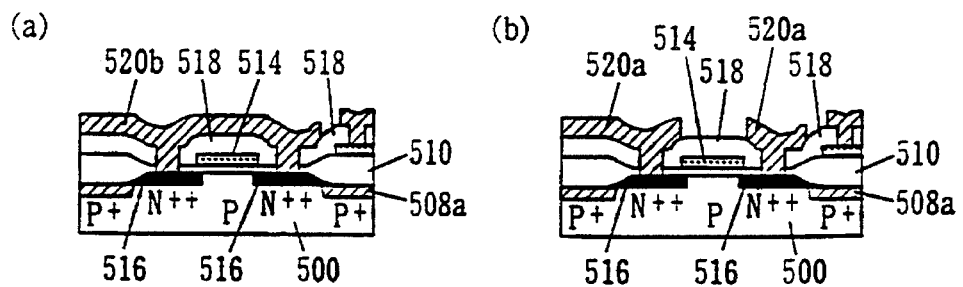

Referring to FIG. 16, interlayer insulating film (PSG film) 518 is selectively etched using a resist pattern as a mask to expose the surface of source and drain regions 516 (formation of contact hole). Then, a low resistance conductor of aluminum for example is grown all over the exposed surface of the semiconductor substrate by PVD (Physical Vapor Deposition) or CVD. Then etching is carried out using a resist pattern (not shown) to form predetermined electrode interconnection layers 520a and 520b. Next, a thermal treatment (sintering) is applied to form good ohmic contact between electrode interconnection layers 520a and 520b and source/drain region 516. In the structure shown in FIG. 16, the FET electrode interconnection layer 520b is patterned so as to extend to an adjacent element in the capacitive element formation region shown in FIG. 16(a).

Figure 17:
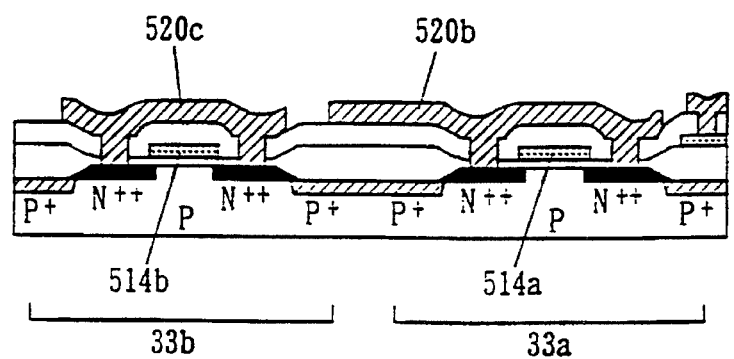
FIG. 17 shows the interconnection state of capacitive elements in the manufacturing step shown in FIG. 16.

As shown in FIG. 17, electrode interconnection layer 520b is connected to gate electrode 514b of capacitive element 33b to function as a capacitive element included in this stabilizing capacitor. The contact hole for gate electrode 514b is formed at the same time the contact hole for the source and drain regions is formed in the step shown in FIG. 16. Electrode interconnection layer 520c of capacitive element 33b is arranged so as to be connected to ground potential at a subsequent step. Gate electrode layer 514a of capacitive element 33a is arranged so as to receive high voltage Vpp. By this wiring step, a capacitive element having a structure identical to that of the FET of the other circuitry as shown in FIG. 16(b) can be formed with no additional manufacturing step.

Figure 18:
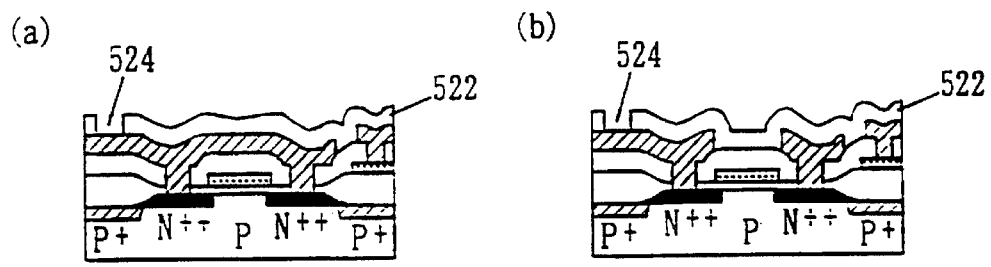
FIG. 18 shows manufacturing steps succeeding the manufacturing step of FIG. 16.

Referring to FIG. 18, the top layers of electrode interconnection layers 520a, 520b and 520c are formed of, for example, aluminum. In order to prevent corrosion and contaminant of the electrode interconnection layer, a protection film 522 of a PSG film or a silicon nitride film by plasma CVD is formed as shown in FIG. 18. Using a resist pattern not shown as a mask, a via hole 524 is formed to form contact with a pad portion for connection with an external terminal or another interconnection layer in a multilayer interconnection structure (in the present embodiment, the protection or passivation layer is an interlayer insulating film). The unrequired resist-film is then removed.

By the above-described structure, a stabilizing capacitive element and a FET in another circuitry can be formed by the same manufacturing process. The stabilizing capacitive element can have a structure identical to that of a FET used in a semiconductor memory device.

In the above-described embodiment, a capacitive element is formed using an n-FET in semiconductor memory device. This n-FET is indicated as used in general circuitry. A capacitive element for high voltage stabilization may have a structure similar to that of selecting transistor 5 of memory cell 1 as shown in FIG. 19A.

Figure 19A:
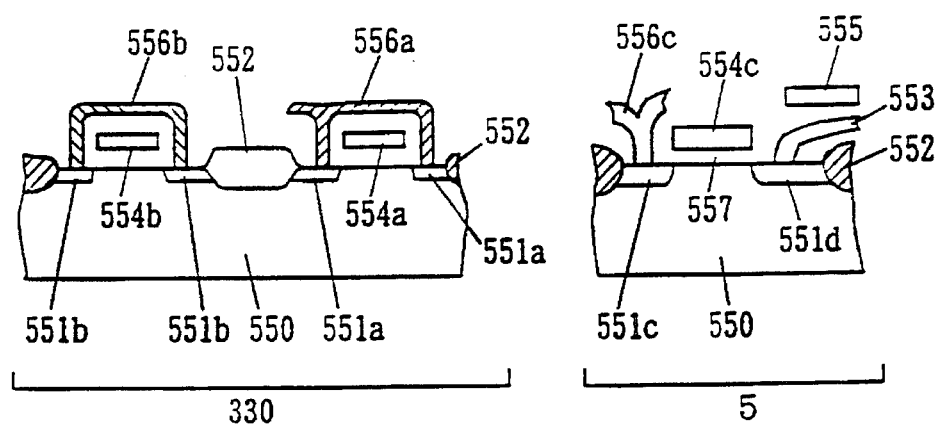
FIGS. 19A and 19B are sectional view of the capacitive element of FIG. 1 according to another structure.

Referring to FIG. 19A, selecting transistor 5 of memory cell 1 includes an impurity region 511c which becomes the source region at the surface of a semiconductor substrate 550, an impurity region 511d which becomes the drain region, a gate electrode layer 554c formed between impurity regions 511c and 511d on the surface of semiconductor substrate 550 with gate insulating film 557 thereunder, an electrode layer 553 on impurity region 551d to form one electrode (storage node) of the memory cell capacitor, and an electrode layer 555 on electrode layer 553 to form the other electrode (cell plate) of the memory cell capacitor.

In general, gate electrode layer 554c, electrode layer 553, and electrode layer 555 are formed of a first level polycrystalline silicon layer, a second level polycrystalline silicon layer, and a third level polycrystalline silicon layer, respectively. Electrode interconnection layer 556c (bit line) corresponding to impurity region 551c which becomes the source region is formed using a low resistance layer such as aluminum layer.

Stabilizing capacitor 330 includes impurity regions 551a and 551b formed on semiconductor substrate 550, a gate electrode 554a formed on impurity region 551, and a gate electrode 554b formed on impurity region 551b. Impurity regions 551a and 551b are formed by the same manufacturing process of impurity regions 551c and 551d of selecting transistor 5 of the memory cell. Gate electrode layers 554a and 554b are formed by the same process of gate electrode 554c of selecting transistor 5.

In stabilizing capacitor 330, impurity region 551b is connected so as to receive ground potential via electrode interconnection layer 556b, and electrode interconnection layer 556a is connected to gate electrode 554b. Gate electrode 554a is connected to receive high voltage Vpp. Electrode interconnection layers 556b and 556a are formed in the same process as that of electrode interconnection layer 556c. The memory cell structure is not limited to that of a stacked capacitor as shown in FIG. 19A, and another capacitor structure such as that of a trench capacitor may be employed.

Figure 19B:
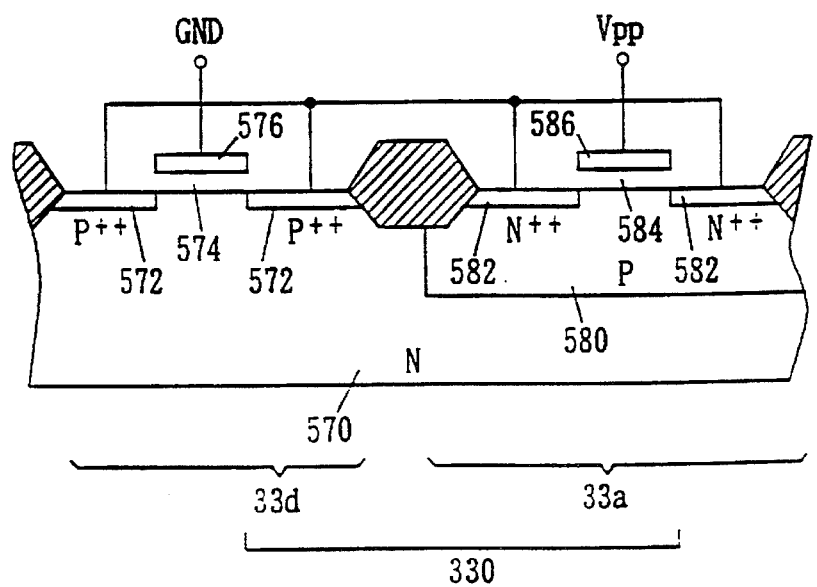

FIG. 19B shows a structure of a stabilizing capacitor formed by a CMOS process. Referring to FIG. 19B, stabilizing capacitor 330 includes capacitive elements 33a and 33d. Capacitive element 33a includes a p type well 580 formed at a predetermined region of an n type semiconductor substrate 570, an n type impurity region 582 formed at the surface of p type well 580, and a gate electrode 586 formed between impurity regions 582 on the surface of the well region with gate insulating film 584 thereunder.

A capacitive element 33d includes a p type impurity region 572 formed at the surface of n type semiconductor substrate 570, and a gate electrode 576 between impurity regions 572 on the surface of the substrate with gate insulating film 574 thereunder. Impurity region 572 is connected to impurity region 582. Gate electrode 586 is connected to receive high voltage Vpp, and gate electrode 576 is connected to receive ground potential GND. Capacitive element 33a is formed of an n-FET, and capacitive element 33d is formed of a p-FET. A stabilizing capacitor can be formed by the same manufacturing process of CMOS circuitry in the semiconductor memory device.

Figure 20:
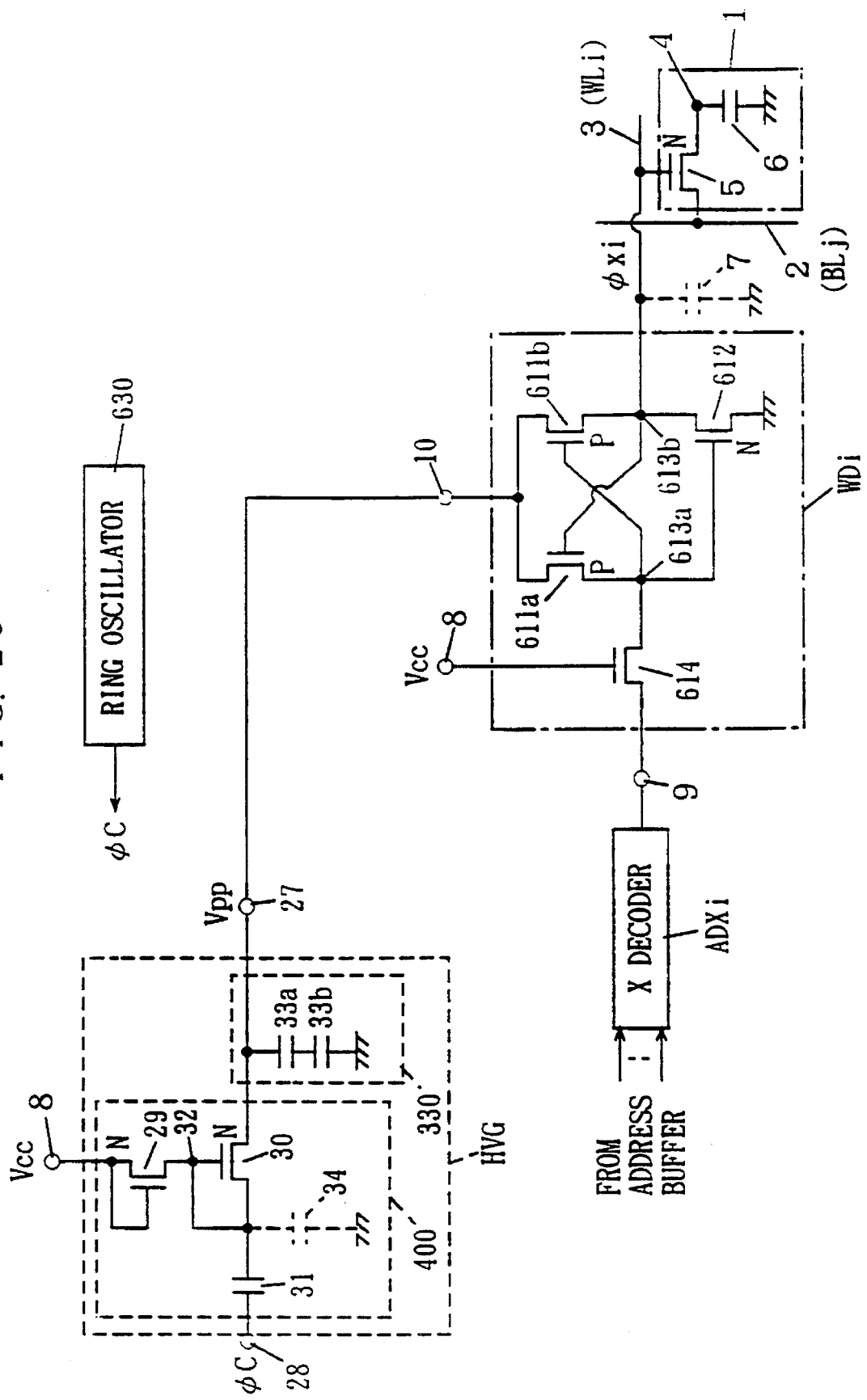
FIG. 20 shows a structure of the main components of a semiconductor memory device according to another embodiment of the present invention.

FIG. 20 shows a structure of a semiconductor memory device according to another embodiment of the present invention. In FIG. 20, an on-chip ring oscillator 630 generates a repetitive signal φc to a high voltage generation circuit HVG (node 28). High voltage generation circuit HVG includes a boosting unit 400 and a stabilizing capacitor 330. The structure thereof is similar to that shown in FIG. 1.

A word line driver WDi is provided corresponding to each word line 3 (WLi). An X decoder ADXi is provided corresponding to word line driver WDi.

Word line driver WDi includes an n-FET 614 for passing through the output of X decoder ADXi provided to a node 9, a p-FET 611a provided between a node 10 receiving high voltage Vpp and a node 613a, a p-FET 611b provided between nodes 10 and 613b, and an n-FET 612 responsive to the potential of node 613a for discharging node 613b to ground potential. p-FETs 611a and 611b have the gates and drains cross-coupled.

A memory cell 1 includes a selecting transistor 5 and a memory capacitor 6. In response to the high level potential of a signal on word line 3, memory capacitor 6 is connected to a bit line 2 (BLi) via selecting transistor 5.

Figure 21:
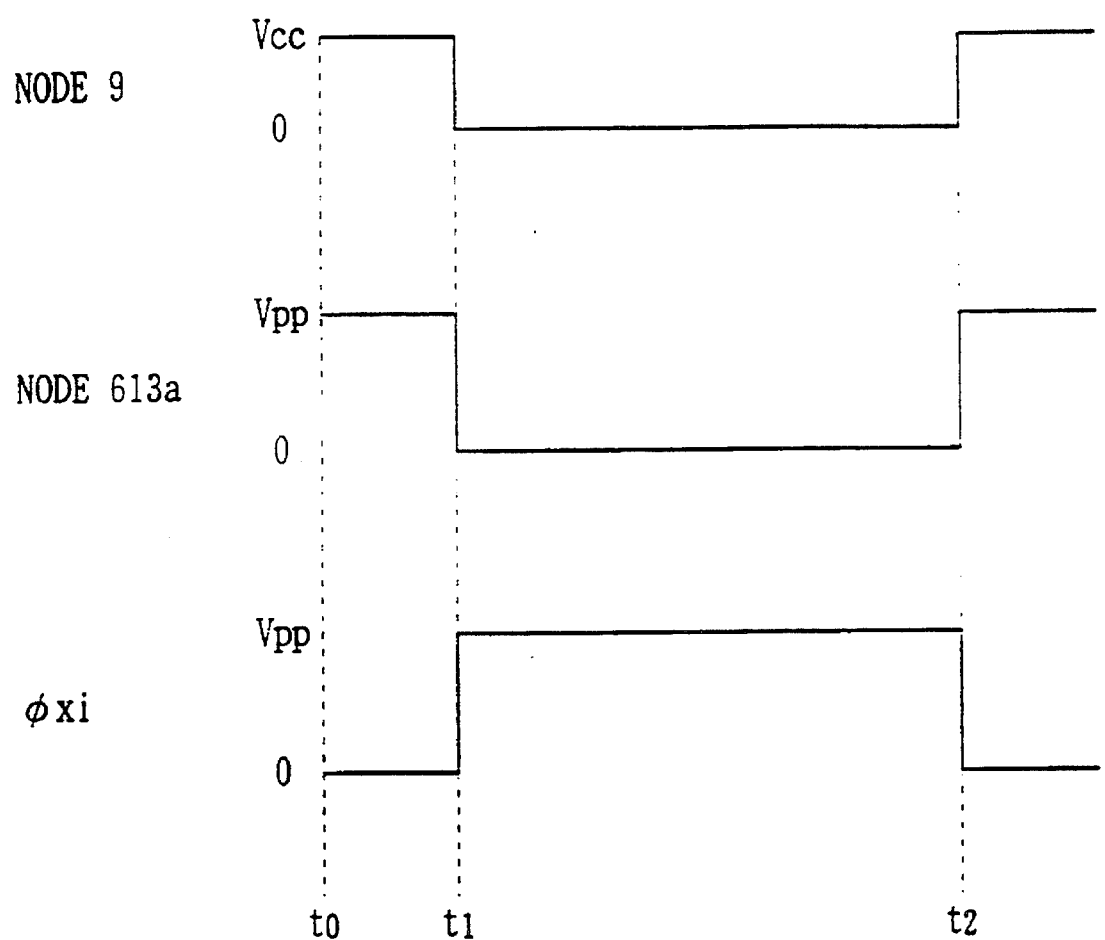
FIG. 21 is a signal waveform diagram showing the operation of the semiconductor memory device of FIG. 20.

The structure shown in FIG. 20 does not include circuitry for generating a word line driving signal φx shown in FIG. 1. High voltage Vpp is applied constantly to word line driver WDi. Delay in the circuit generating a word line driving signal φX can be eliminated, and a word line is driven at high speed. Therefore, the memory cell access speed is improved. In word line driver WDi, the size (or gate width) of p-FET 611b must be greater than that of n-FET 612. This is because word line 3 must be charged at high speed.

n-FET 614 receives an internal operating power supply voltage Vcc via node 8 at its gate. n-FET 614 serves to prevent high voltage Vpp from being applied to node 9. The operation of word line driver WDi shown in FIG. 20 is described hereinafter with reference to FIG. 21 which is a waveform diagram.

When X decoder ADXi attains a selected state, the output thereof falls from a H level to a L level. At time t0, a row selecting operation is not carried out, and the potential of node 9 attains a H level of internal operating power supply voltage Vcc. Under this state, high voltage Vpp is applied constantly in node 10. Because node 613a receives a signal of H level via n-FET 614, n-FET 612 is ON to discharge the potential of node 613b to the level of ground potential. In response, p-FET 611a is turned on whereby the potential of node 613a rises and p-FET 611b is deeply turned off. Therefore, the potential of node 613a eventually attains the level of high voltage Vpp.

At time t1, a row selecting operation is executed, and the potential of node 9 falls to L level. The potential of node 613a is discharged via n-FET 614 and node 9 (via X decoder X ADXi) towards the level of ground potential. As a result, n-FET 612 is turned off, p-FET 611b is turned on, and p-FET 611a is turned on. Node 613b rises to the level of high voltage Vpp via the p-FET, so that a word line driving signal φxi of the level of high voltage Vpp is transmitted on word line 3. In the structure shown in FIG. 20, the potential of word line 3 (word line driving signal φxi) rises simultaneously with the selection of X decoder ADXi, so that selecting transistor 5 of memory cell 1 is rapidly turned on, resulting in increase of the speed of data access.

When a memory cycle is completed at time t2, the potential of X decoder ADXi rises to the H level of internal operating power supply voltage Vcc. As a result, the potential of node 613a is charged to the level of Vcc-VTN via n-FET 614. When the potential of node 613a attains the level of Vcc-VTN, n-FET 612 is turned on to discharge node 613b to the level of ground potential, and p-FET 611a is turned on to raise the level of node 613a to high voltage Vpp. As a result, p-FET 611b is completely turned off, and node 613b is discharged to the level of ground potential by n-FET 612.

A stabilizing capacitor 330 for stabilizing high voltage Vpp includes capacitive elements 33a and 33b connected in series even in the case of a structure of a word line driving system as shown in FIG. 20. Therefore, high voltage Vpp can be generated in stability, whereby a selected word line can be charged at high speed to the level of high voltage.

Internal operating power supply voltage Vcc is described hereinafter. An external power supply voltage Vd may be directly used as internal operating power supply voltage Vcc (that is to say, Vd=Vcc). For example, in a system such as a portable personal computer with a battery as the power source, the power consumption of a whole system must be minimized to increase the life time of the battery. In order to reduce power consumption, the operating power supply voltage of a dynamic random access memory is reduced. Because power consumption is proportional to the square of the voltage, power consumption can be reduced to a satisfactory level by providing a low operating power supply voltage. Lowering the power supply voltage will also reduce the heat amount associated with power consumption. Therefore, a dynamic random access memory may be accommodated in an economical plastic package.

When an external power supply voltage is lowered and directly used as an internal operating power supply voltage of a random access memory, FETs of the memory cell array and peripheral circuitry of the dynamic random access memory at least have a gate insulating film of the same thickness (or the same structure). Therefore, the capacitor of the above-described embodiments for stabilizing high voltage for driving a word line utilizes a FET having a structure (or a thickness of a gate insulating film) identical to that of the FET of the memory cell array or peripheral circuitry.

A dynamic random access memory is known in which an external power supply voltage Vd is lowered by an on-chip internal voltage-down circuit to generate an internal operating power supply voltage Vcc (Vd>Vcc). This is done because advance in miniaturization of logic LSIs such as microprocessor units determining the system power supply voltage does not follow that of a dynamic random access memory and the system power supply voltage cannot be reduced according to miniaturization of a dynamic random access memory. In this case, an internal voltage-down circuit reduces the external power supply voltage to generate an internal operating power supply voltage Vcc, to ensure reliability of a dynamic random access memory (reliability of gate insulating film of FET).

The structure of a dynamic random access memory is mainly classified into two classes according to where the internal down-converted power supply voltage is to be applied. More specifically, (1) the internal down-converted power supply voltage is applied to both peripheral circuitry and memory cell array, and (2) the external power supply voltage is applied to the peripheral circuitry, and the internal down-converted power supply voltage is applied only to the memory cell array.

In the first structure, the operating power supply voltage in an entire dynamic random access memory is reduced. This provides the advantage of speeding up the operation in addition to the aforementioned advantages in reliability and power consumption of a dynamic random access memory. The operating speed of peripheral circuitry proportional to the driving capability of a FET is dependent upon the operating power supply voltage, particularly upon the gate voltage. A repetitive pattern circuit in which identical patterns are repeated as in a memory cell array and sense amplifier has a great load capacitance. Therefore, the operating speed is determined by an RC time constant determined by a load capacitor and resistance, and is not so greatly influenced by the power supply voltage as in the peripheral circuitry. In a dynamic random access memory, a great margin is established for the operation timing of peripheral circuitry to avoid mismatching operation between peripheral circuitry and the repetitive pattern circuit. By reducing the power supply voltage of peripheral circuitry, this operation timing margin can be reduced to result in reduction of the access time.

In the first structure (1), the thicknesses of the gate insulating films of FETs in peripheral circuitry and the memory cell array are identical with each other (the size is different). Therefore, a FET of a structure (thickness of the gate insulating film) identical to that of a FET of peripheral circuitry and the memory cell array can be used as the capacitor for stabilizing high voltage for driving a word line.

In the second structure (2), an internal down-converted power supply voltage is applied to the word line receiving the highest voltage or the circuit that directly drives this word line in order to ensure reliability thereof. Power consumption is suppressed significantly since the power supply voltage of the memory cell array is reduced. In this case, the gate insulating film of the FET of peripheral circuitry to which external power supply voltage is applied is made thicker than that of the FET of the memory cell array.

Figure 22:
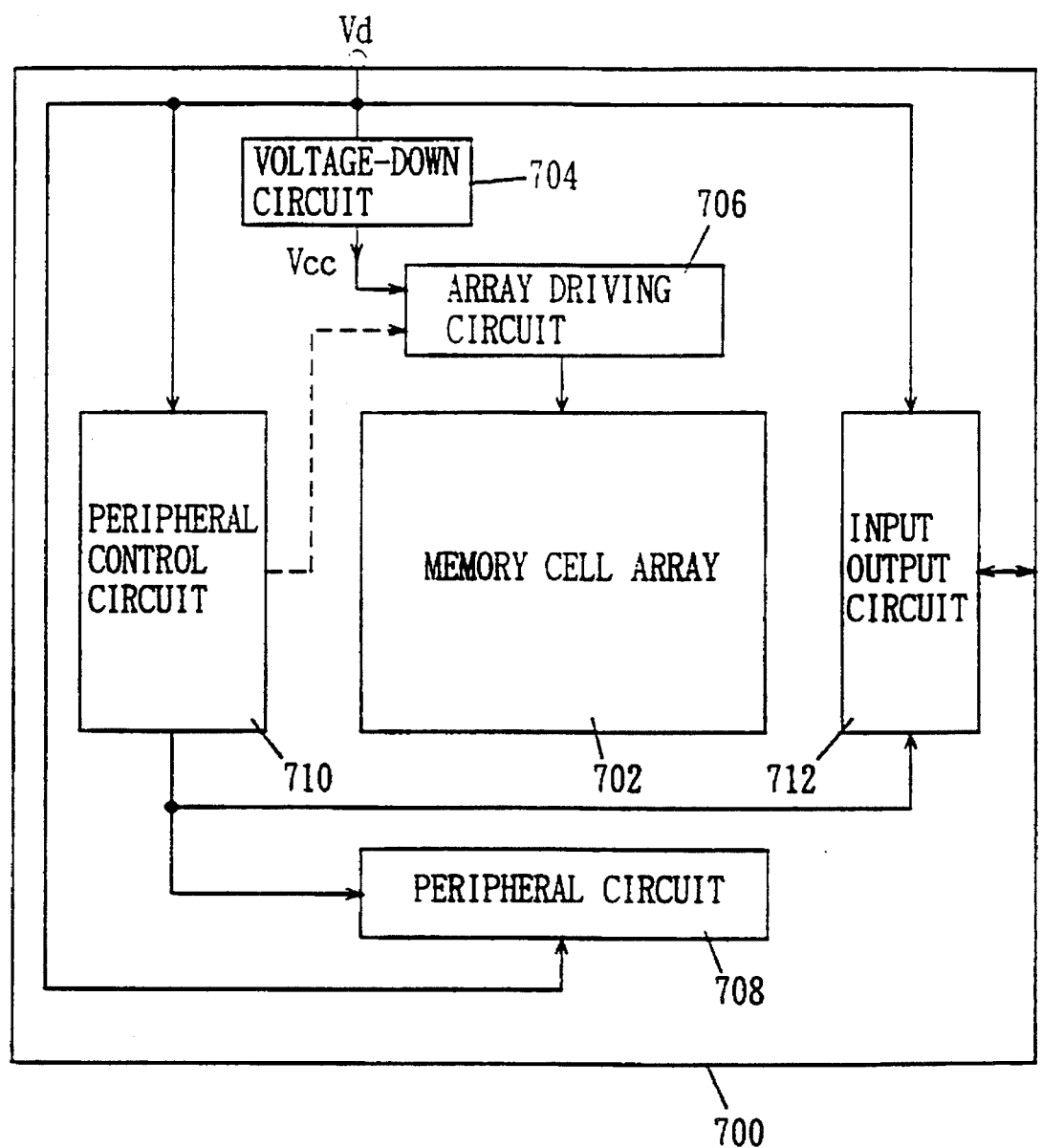
FIG. 22 schematically shows a structure of a semiconductor memory device according to a further embodiment of the present invention.

FIG. 22 schematically shows the structure of a dynamic random access memory including an internal voltage-down circuit. Referring to FIG. 22, a dynamic random access memory 700 includes a memory cell array 702 having memory cells arranged in a matrix of rows and columns, a voltage-down circuit 704 for down-converting an external power supply voltage Vd to an internal power supply voltage Vcc of a predetermined voltage level, an array driving circuit 706 operating with internal power supply voltage Vcc from voltage-down circuit 704 for driving memory all array 702, a peripheral circuit 708 operating with external operating power supply voltage Vd as the operating power supply voltage, a peripheral control circuit 710 operating with external power supply voltage Vd as the operating power supply voltage for controlling the operation of peripheral circuit 708, and an input/output circuit 712 with external power supply voltage Vd as the operating power supply voltage for input/output of a signal with an external device. Input/output circuit 712 operates under the control of peripheral control circuit 710.

Array driving circuit 706 includes a word line driving circuit, a sense amplifier circuit, a sense amplifier driving circuit, and a precharge/equalize circuit. In other words, array driving circuit 706 includes the circuitry for transmitting a signal directly to memory cell array 702.

Peripheral circuit 708 includes an address decoder (X and Y). Peripheral control circuit 710 controls the operation of input/output circuit 712 in addition to that of peripheral circuit 708, and generates each internal control signal in response to externally applied control signals /RAS, /CAS, and /WE. Peripheral control circuit 710 may be implemented to generate a signal defining the operation timing of array driving circuit 706.

Input/output circuit 712 includes an address buffer in addition to a data input/output circuit. Input/output circuit 712 performs input/output of a signal with an external device, with external power supply voltage Vd as the operating power supply voltage. To serve as an interface with an external device, input/output circuit 712 includes a buffer circuit. Therefore, peripheral circuit 708 may include a writing circuit for receiving an output of input/output circuit (buffer circuit) 712 to generate an internal write data, and a preamplifier circuit for amplifying a data read out of the memory cell array.

In the structure shown in FIG. 22, the FET components of array driving circuit 706 and memory cell array 702 are reduced in film thickness, and the gate insulating films of the FETs of voltage-down circuit 706, peripheral circuit 708, input/output circuit 712, and peripheral control circuit 710 are increased in thickness.

When a FET is used as a capacitor, the thickness of the gate insulating film must be minimized to reduce the occupying area. Therefore, a FET of a structure (thickness of gate insulating film) identical to that in memory cell array 702 and array driving circuit 706 is used as a capacitive element included in the capacitor for stabilizing word line driving high voltage Vpp. Even if the thickness of the gate insulating film is reduced, high voltage Vpp is divided to be applied across each capacitive element, so that the dielectric breakdown voltage characteristics are ensured. Thus, a capacitive element reduced in occupying area can be obtained.

In a dynamic random access memory employing an internal voltage-down circuit, the gate insulating films of the FETs of the internal voltage-down circuit and the input/output circuit are made thick in both the above-described structures (1) and (2). This is to operate these circuits with an external power supply voltage Vd to establish interface with an external source or device. However, such internal voltage-down circuit and input/output circuits have the thickness of the gate insulating film reduced according to the reduction of applied power supply voltage. The size of a FET is optimized based on the thickness of the gate insulating film. As the gate insulating film becomes thinner, the gate length becomes smaller to reduce the gate delay (signal transfer delay). This results in increasing the speed. This also holds for the case where an internal voltage-down circuit is not used and an external power supply voltage is used as the internal power supply voltage without reduction.

However, because an input/output circuit is connected to an external terminal (lead terminal), reduction in the gate insulating film in proportion to the applied operating power supply voltage will induce degradation of reliability. This will be described in details hereinafter.

Figure 23A:
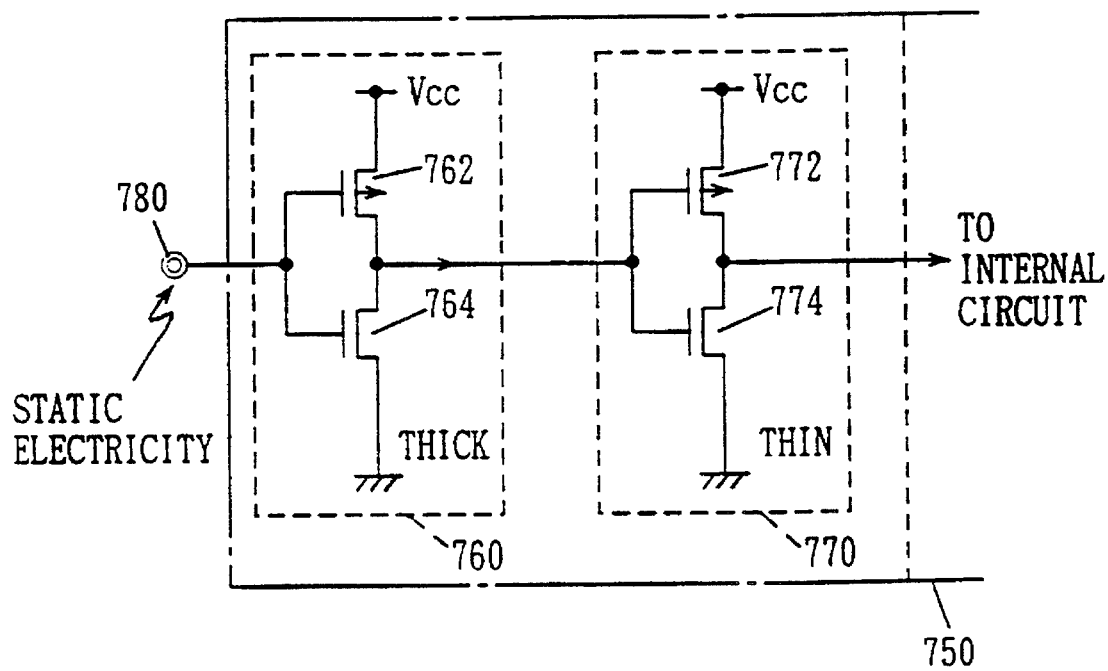
FIGS. 23A and 23B specifically show structures of a signal input circuit and a signal output circuit in a semiconductor memory device.
Figure 23B:
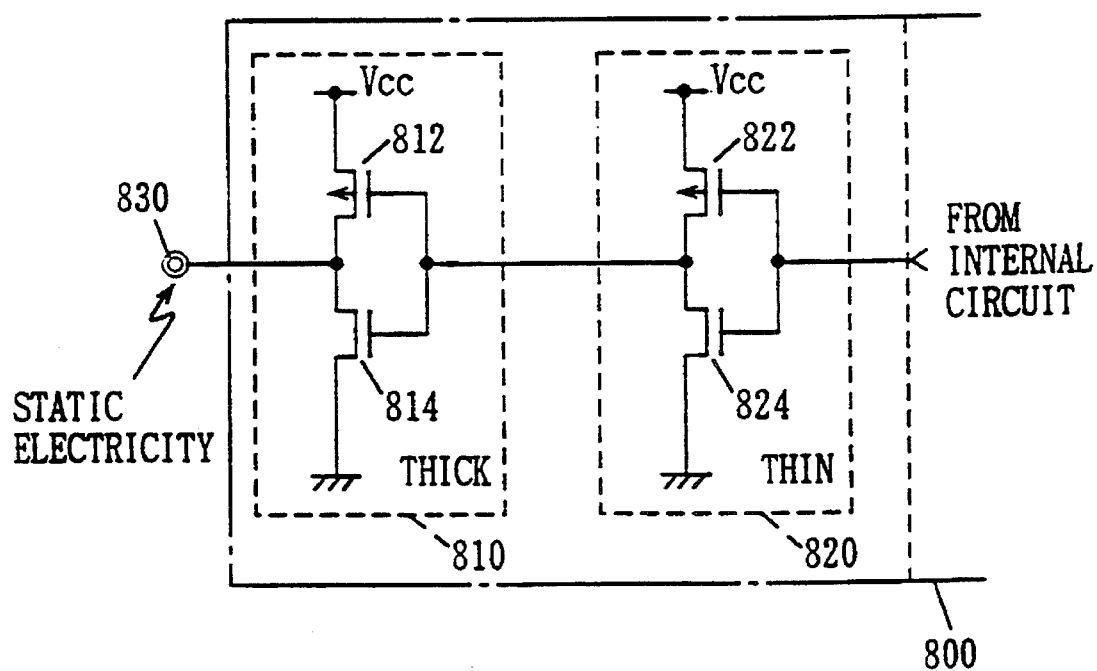

FIG. 23 shows an example of a structure of an input/output circuit. FIG. 23A shows a structure of a signal input circuit (input buffer), and FIG. 23B shows a structure of a signal output circuit (output buffer). The buffer circuit of FIGS. 23A and 23B may be an address buffer, a data input buffer, and a data output buffer.

Referring to FIG. 23A, a signal input circuit 750 includes cascade-connected two stages of inverter circuits 760 and 770. Inverter circuit 760 includes a p-FET 762 and an n-FET 764 complementary-connected between a power supply voltage (may be an external power supply voltage or an internal power supply voltage) Vcc and ground potential. The gates of p-FET 762 and n-FET 764 are connected to an external terminal (lead terminal) 780. Inverter circuit 770 includes a p-FET 772 and an n-FET 774 complementary-connected between power supply voltage Vcc and ground potential. An output of inverter circuit 760 of the first stage is applied to the gates of p-FET 722 and n-FET 774. An output of inverter circuit 770 is applied to an internal circuit to carry out a desired signal process.

The gate insulating films of FETs 772 and 774 which are the components of inverter circuit 770 can be reduced in thickness according to power supply voltage Vcc. However, the gate insulating film of FETs 762 and 764 cannot be reduced with power supply voltage Vcc in the first stage of inverter circuit 760 directly connected to an external terminal. A charging/discharging clamp diode (protection diode) for clamping abnormal high voltage is provided between external terminal 780 and the input portion of inverter circuit 760. Such a protection diode is provided between external terminal 780 and a power supply voltage node, and between external terminal 780 and ground potential. If a charged human body or object comes into contact with external terminal 780, discharge occurs in external terminal 780 to apply a great electrostatic field to FETs 762 and 764 despite the provision of a clamp diode. In order to protect FETs 762 and 764 from such electrostatic field, the gate insulating films of FETs 762 and 764 must be relatively increased in thickness. Therefore, as shown in the structure of FIG. 23A, the gate insulating films of FETs 762 and 764 forming inverter circuit 760 are made relatively thick, and the gate insulating film of the FET of inverter circuit 770 is reduced according to power supply voltage Vcc.

This static electricity problem also occurs in a signal output circuit as shown in FIG. 23B. Referring to FIG. 23B, a signal output circuit (output buffer 800) includes cascade-connected inverter circuits 820 and 810. Inverter circuit 820 has a CMOS structure and includes a p-FET 822 and an n-FET 824. Similarly, inverter circuit 810 has a CMOS structure, and includes a p-FET 812 and an n-FET 814. Inverter circuit 820 inverts and amplifies a signal applied from an internal circuit. Inverter circuit 810 further amplifies and inverts and transmits the output from inverter circuit 820 to external terminal 830. When discharge of static electricity occurs in external terminal 830, a great electrostatic field is generated in FET 820 and/or 814 as in the case of inverter circuit 760 of FIG. 23A. Therefore, the gate insulating films of FETs 812 and 814 are made thicker than those of FETs 820 and 824.

In the above-described embodiment where a series of capacitive elements are used as the capacitor for stabilizing high voltage for driving a word line, a FET minimized in gate insulating film thickness is used (to realize a great capacitance value with a smaller area). Therefore, FET of circuitry to which a reduced internal power supply voltage is applied (in partial internal voltage-down scheme), or an arbitrary FET within the device is used (in overall internal voltage-down scheme). More specifically, the capacitor includes FET similar to that of circuitry directly transmitting a signal to the memory cell array portion or word line driving circuit.

However, the usage of the structure of the signal input/output circuit as shown in FIGS. 23A and 23B allows formation of a high voltage stabilization capacitor by using a FET of the circuitry connected to an external terminal (first stage of input buffer or last stage of output buffer).

Figure 24:
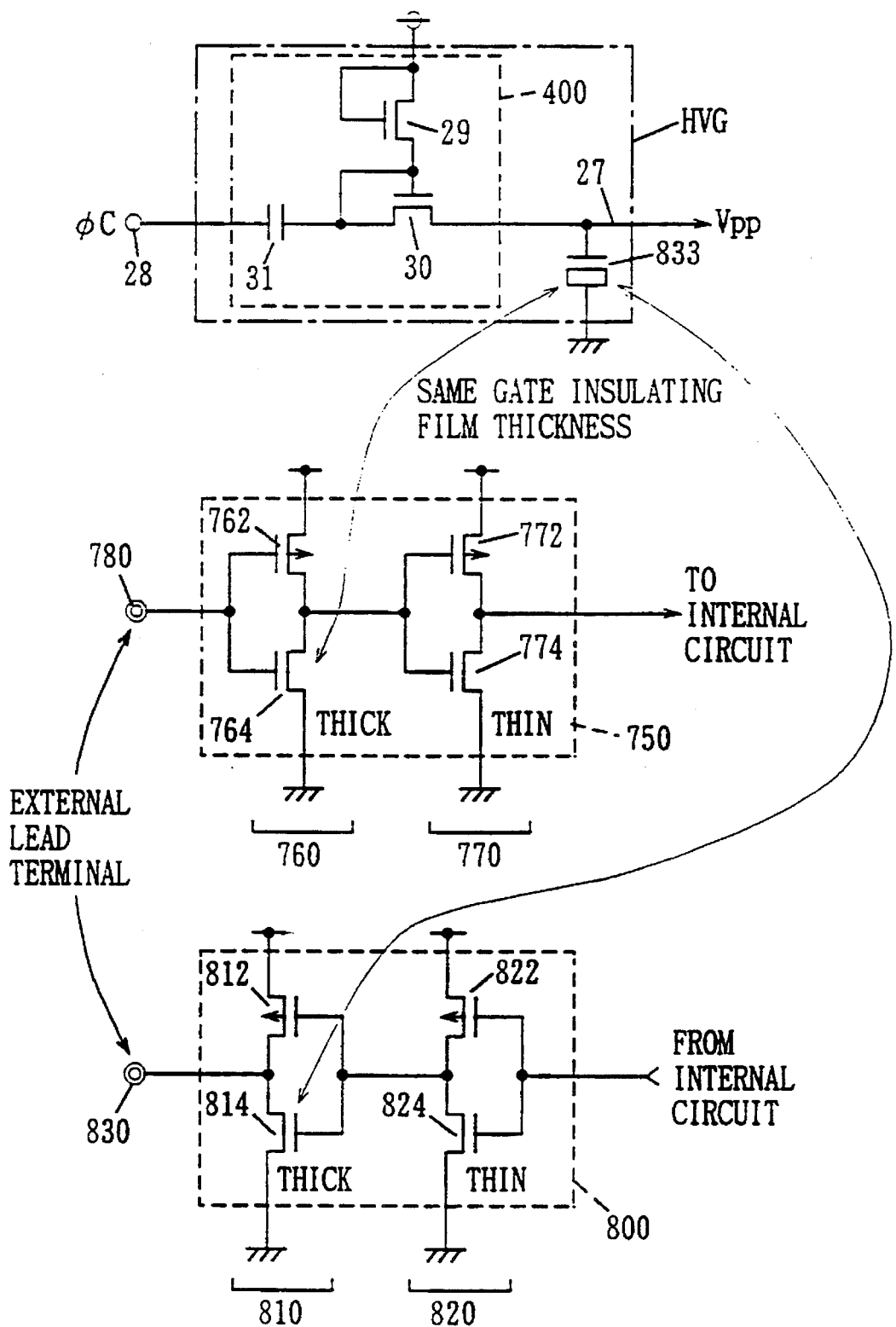
FIG. 24 shows a structure of the main components of a semiconductor memory device according to still another embodiment of the present invention.
Figure 25:
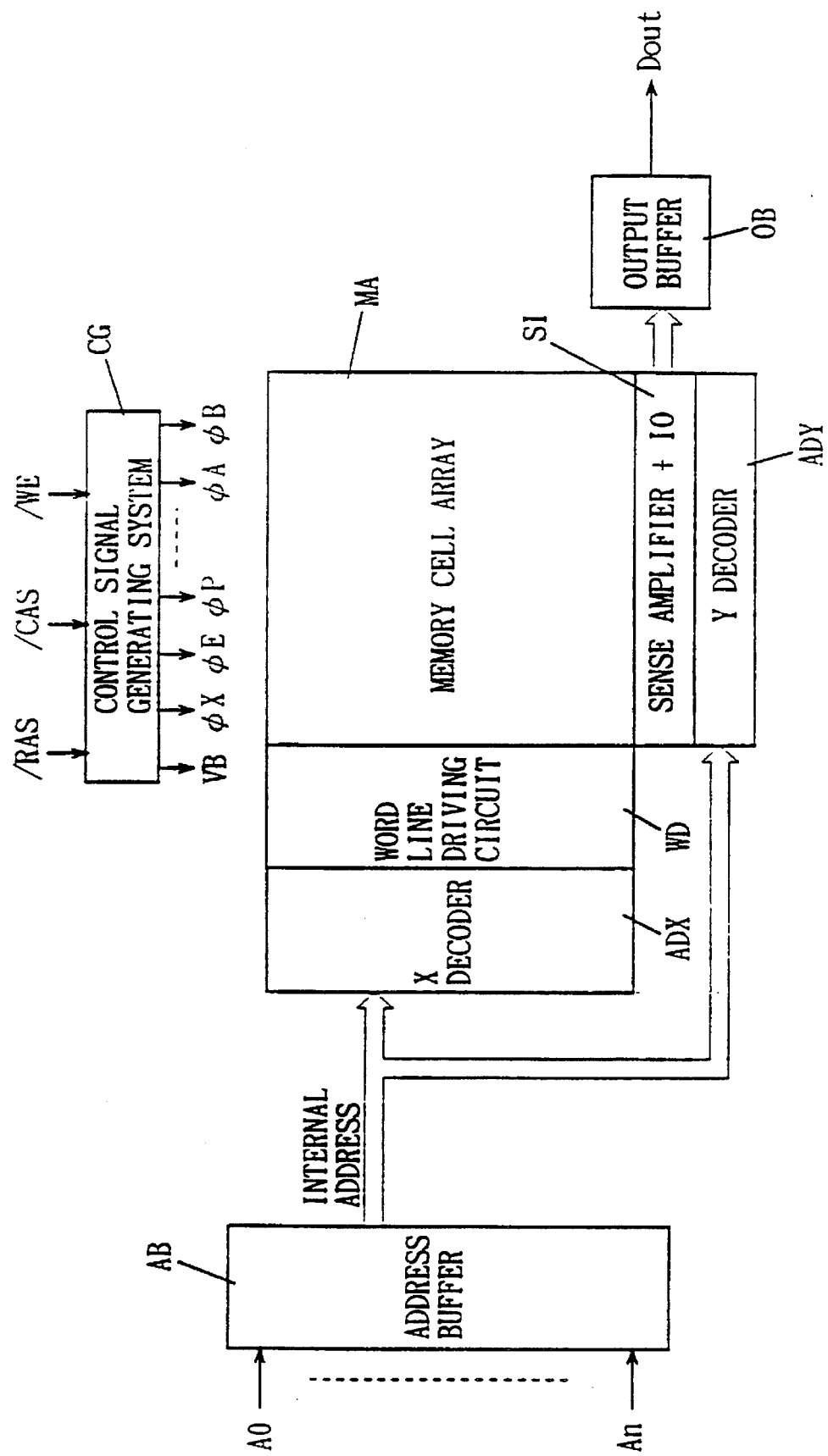
FIG. 25 schematically shows a structure of a conventional semiconductor memory device.
Figure 26:
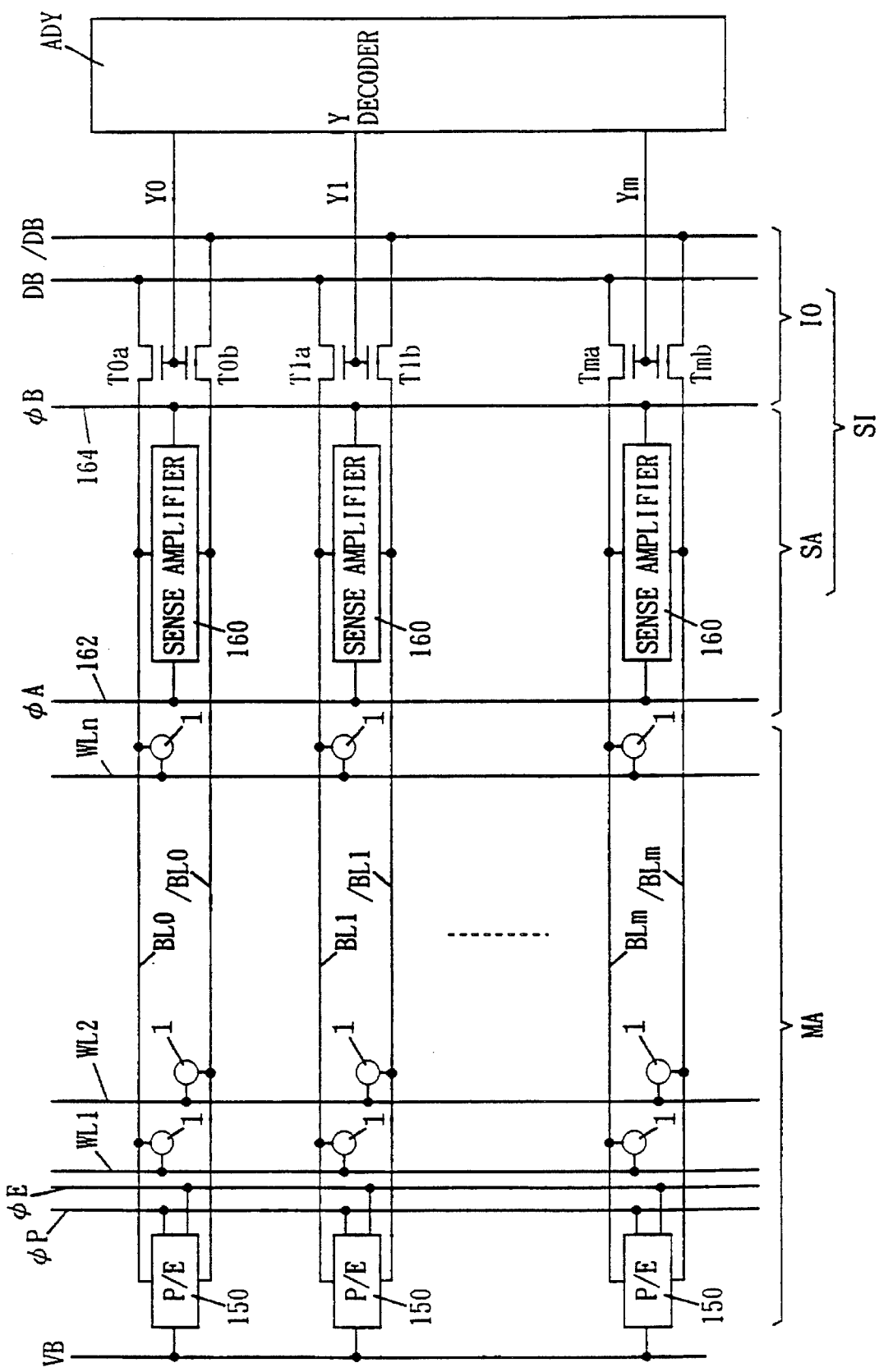
FIG. 26 shows the structure of a memory cell array and relating circuitry of the semiconductor memory device of FIG. 25.

FIG. 24 shows a structure of the components of a semiconductor memory device according to a second embodiment of the present invention. Referring to FIG. 24, a high voltage generation circuit HVG, a signal input circuit (input buffer) 750, and a signal output circuit (output buffer) 800 are shown. The structures of signal input circuit 750 and signal output circuit 800 are similar to those shown in FIGS. 23A and 23B. In signal input circuit 750, the gate insulating films of FETs 762 and 764 forming inverter circuit 760 are made thicker than those of FETs 772 and 774 forming inverter circuit 770.

In signal output circuit 800, the gate insulating film of FETs 812 and 814 forming inverter circuit 810 is made thicker than that of FETs 822 and 822 forming inverter circuit 820. The gate insulating film of FETs 772, 774, 822, and 824 is made thicker than that of the FET of the circuitry to which an internal reduced voltage is applied. Electrostatic breakdown is prevented by providing a thick gate insulating film of FETs 762, 764, 812 and 814.

High voltage generating circuit HVG includes a boosting unit 400 and a stabilizing capacitor 833. The structure of boosting unit 400 is similar to that shown in FIG. 1. Stabilizing capacitor 833 includes one capacitive element. Stabilizing capacitor 833 has a structure (gate insulating film thickness) identical to those of n-FET 764 of signal input circuit 750 and/or n-FET 814 of signal output circuit 800. In this case, stabilizing capacitor 833 and n-FET 764 and/or 814 have the portion shown in FIG. 17 omitted in the structures showing the manufacturing process. Stabilizing capacitive element 833 is formed using one FET. Because dielectric breakdown voltages of n-FET 764s and 814 are high enough, high voltage Vpp can be generated in stability without dielectric breakdown even in the case where high voltage Vpp is generated constantly. By using the manufacturing process shown in FIGS. 6–18, n-FETs 764 and 814 and stabilizing capacitor 833 can be formed by the same manufacturing process.

Stabilizing capacitor 833 can be formed using p-FETs 762 and/or 812. By forming a stabilizing capacitor using one FET, a stabilizing capacitor superior in space efficiency can be realized.

The signal input circuit may include any of a data input circuit and an address buffer, and a signal output circuit may include a data output circuit. The signal input circuit and signal output circuit is not limited to the structure of a cascade-connected inverter circuits of two stages. An effect similar to the above-described second embodiment can be obtained with a stabilizing capacitor using a FET of circuitry connected to an external terminal and directly inputting/outputting a signal.

In the above first and second embodiments, a capacitor for stabilizing word line driving high voltage was described in a dynamic random access memory. It is to be noted that a similar effect can be obtained with a static random access memory including a flipflop type memory cell structure.

In the above embodiments, a structure of a capacitor for stabilizing high voltage for driving a word line in a semiconductor memory device was described. A similar effect can be obtained with a semiconductor integrated circuit device including a high voltage generation circuit that generates a high voltage from a power supply potential within a device.

In accordance with the present invention, a series of capacitive elements or a FET of circuitry receiving/transmitting directly a signal with an external terminal is used as a stabilizing capacitor for stabilizing a word line driving high voltage to improve significantly the insulating characteristics of a stabilizing capacitor. Consequently, a semiconductor memory device of high reliability is provided in which a word line driving high voltage is generated in stability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. The semiconductor memory device, comprising:

a memory cell array including a plurality of memory cells arranged in a matrix of rows and columns, wherein each of said memory cells comprises an insulating gate type field effect transistor, a plurality of word lines, each having a row of memory cells connected, word line selecting means responsive to an address signal for generating a word line selecting signal to select a word line of said plurality of word lines, boosting means for boosting a first power supply voltage applied to a first power supply node to generate a high voltage, word line driving means responsive to a word line selecting signal from said word line selecting means for transmitting a high voltage generated by said boosting means to a selected word line, a plurality of capacitive elements connected in series between an output node of said boosting means and a second power supply voltage node, and wherein each of said plurality of capacitive elements is formed by an insulating gate type field effect transistor having an insulating film identical in thickness to that of the transistor of said memory cell.

2. The semiconductor memory device, comprising:

a memory cell array including a plurality of memory cells arranged in a matrix of rows and columns, plurality of word lines, each having a row of memory cells connected, word line selecting means responsive to an address signal for generating a word line selecting signal to select a word line of said plurality of word lines, boosting means for boosting a first power supply voltage applied to a first power supply node to generate a high voltage, word line driving means responsive to a word line selecting signal from said word line selecting means for transmitting a high voltage generated by said boosting means to a selected word line, a plurality of capacitive elements connected in series between an output node of said boosting means and a second power supply voltage node, further comprising a voltage-down circuit for down-converting an externally applied power supply voltage for generating an internal power supply voltage, wherein each of said plurality of capacitive elements is formed by an insulating gate type field effect transistor having an insulating film identical in thickness to that of an insulating gate type field effect transistor included in a circuit to which said internal power supply voltage is applied.

3. The semiconductor memory device, comprising:

a memory cell array including a plurality of memory cells arranged in a matrix of rows and columns, a plurality of word lines, each having a row of memory cells connected, word line selecting means responsive to an address signal for generating a word line selecting signal to select a word line of said plurality of word lines, boosting means for boosting a first power supply voltage applied to a first power supply node to generate a high voltage, word line driving means responsive to a word line selecting signal from said word line selecting means for transmitting a high voltage generated by said boosting means to a selected word line, a plurality of capacitive elements connected in series between an output node of said boosting means and a second power supply voltage node, wherein said word line driving means includes an insulated gate type field effect transistor as a component, and wherein each of said capacitive elements is formed of an insulated gate type field effect transistor having a gate insulating film identical in thickness to that of the insulated gate type field effect transistor included in said word line driving means.

4. The semiconductor memory device, comprising:

a memory cell array including a plurality of memory cells arranged in a matrix of rows and columns, a plurality of word lines, each having a row of memory cells connected, word line selecting means responsive to an address signal for generating a word line selecting signal to select a word line of said plurality of word lines, boosting means for boosting a first power supply voltage applied to a first power supply node to generate a high voltage, word line driving means responsive to a word line selecting signal from said word line selecting means for transmitting a high voltage generated by said boosting means to a selected word line, plurality of capacitive elements connected in series between an output node of said boosting means and a second power supply voltage node, further comprising array driving means including an insulated gate type field effect transistor and coupled to said memory cell array for transmitting a driving signal directly to said memory array, and wherein each of said capacitive elements is formed by an insulating gate type field effect transistor having a gate insulating film identical in thickness to that of the transistor included in said array driving means.

5. A semiconductor memory device comprising:

a memory cell array including a plurality of memory cells arranged in a matrix of rows and column, a plurality of word lines, each having a row of memory cells connected thereto, word line selecting means responsive to an address signal for generating a word line selecting signal to select a word line of said plurality of word lines, boosting means for boosting a first power supply voltage for generating a high voltage, word line driving means responsive to the word line selecting signal from said word line selecting means for transmitting the high voltage generated by said boosting means on the selected word line, a first circuit formed of an insulating gate type field effect transistor, and directly connected to an external terminal for carrying out input/output of a signal with an external device, a capacitive element formed of an insulating gate type field effect transistor having an insulating film identical in thickness to that of a gate insulating film of said insulating gate type field effect transistor of said first circuit, and provided between an output node of said boosting means and a second power supply voltage source.

6. A semiconductor memory device including an external terminal receiving an external signal and operating with an power supply voltage comprising:

a first inverter connected to directly receive said external signal applied at said external terminal, and including an insulated gate type field effect transistor having a gate insulation film of a first thickness;

a second inverter coupled to receive an output of said first inverter for generating an internal signal, and including an insulated gate type field effect transistor, having a gate insulation film of a second thickness smaller than said first thickness;

high voltage generator responsive to a clock signal for boosting said power supply voltage to generate a high voltage at an output node; and a capacitor element coupled to said output node, for stabilizing said high voltage, and being formed of an insulated gate type field effect transistor having a gate insulating film of said first thickness.

7. The semiconductor memory device according to claim 6, further including a voltage-down converter for down-converting an external power supply voltage to generate said power supply voltage, and wherein said first and second inverters operate with said external power supply voltage as an operating power supply voltage.

8. A semiconductor memory device including an external terminal for supply an external signal and operating with a power supply voltage, comprising:

a first inverter including an insulated gate type field effect transistor having a gate insulation film of a first thickness, for receiving an internal signal from an internal circuit;

a second inverter directly connected to said external terminal and responsive to an output of said first inverter for driving said output, and including an insulating gate type field effect transistor having a gate insulation film of a second thickness greater than said first thickness;

high voltage generator responsive to a clock signal for boosting the power supply voltage to generate a high voltage at an output node; and a capacitor element connected to said output node for stabilizing said high voltage, and including an insulated gate type field effect transistor having a gate insulation film of said second thickness.

9. The semiconductor memory device according to the claim 8, further including a voltage-down converter for down-converting an externally applied power supply voltage to generate said power supply voltage, and wherein said externally applied power supply voltage is applied to said first and second inverters as an operating power supply voltage.

* * * * *